United States Patent
Bae et al.

(10) Patent No.: US 12,315,454 B2
(45) Date of Patent: May 27, 2025

(54) DISPLAY DEVICE AND OPERATING METHOD THEREFOR

(71) Applicant: Samsung Display Co., Ltd., Yongin-Si (KR)

(72) Inventors: Min Seok Bae, Yongin-si (KR); Bong Hyun You, Yongin-si (KR); Hui Nam, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/790,469

(22) PCT Filed: Jul. 3, 2020

(86) PCT No.: PCT/KR2020/008762
§ 371 (c)(1),
(2) Date: Jun. 30, 2022

(87) PCT Pub. No.: WO2021/157791
PCT Pub. Date: Aug. 12, 2021

(65) Prior Publication Data
US 2023/0043940 A1 Feb. 9, 2023

(30) Foreign Application Priority Data
Feb. 6, 2020 (KR) .......................... 10-2020-0014331

(51) Int. Cl.
*G09G 3/32* (2016.01)
*G09G 3/3258* (2016.01)
*G09G 3/3266* (2016.01)

(52) U.S. Cl.
CPC ......... *G09G 3/3258* (2013.01); *G09G 3/3266* (2013.01); *G09G 2300/0452* (2013.01);
(Continued)

(58) Field of Classification Search
CPC ........ H01L 27/32; G09G 3/3275; G09G 3/20; G09G 3/3258
See application file for complete search history.

(56) References Cited

U.S. PATENT DOCUMENTS

| | | |
|---|---|---|
| 8,026,876 B2 | 9/2011 | Nathan et al. |
| 9,373,281 B2 | 6/2016 | Wu et al. |

(Continued)

FOREIGN PATENT DOCUMENTS

| | | |
|---|---|---|
| CN | 102243839 A | 11/2011 |
| CN | 103236237 A | 8/2013 |

(Continued)

OTHER PUBLICATIONS

International Search Report for International Application No. PCT/KR2020/008762 dated Oct. 21, 2020, 6 pages with English Translation thereof.

(Continued)

*Primary Examiner* — Michael A Faragalla
(74) *Attorney, Agent, or Firm* — Innovation Counsel LLP

(57) ABSTRACT

A display device and a driving method thereof are provided. The display device includes a display panel that includes a first display area in which a plurality of first pixels are disposed and a second display area in which a plurality of second pixels are disposed; and at least one sensor overlapping the second display area and not overlapping the first display area of the display panel, wherein the plurality of first pixels and the plurality of second pixels are connected to a scan line providing a scan signal and a data line providing a data signal, and wherein the plurality of first pixels are not connected to a sensing control line providing a sensing control signal that senses an anode voltage of a light emitting element.

17 Claims, 24 Drawing Sheets

(52) U.S. Cl.
CPC ............... *G09G 2300/0465* (2013.01); *G09G 2310/0286* (2013.01); *G09G 2320/043* (2013.01); *G09G 2360/14* (2013.01)

(56) References Cited

U.S. PATENT DOCUMENTS

| | | | |
|---|---|---|---|
| 9,607,551 | B2 | 3/2017 | Kim et al. |
| 9,646,533 | B2 | 5/2017 | Hong et al. |
| 9,679,516 | B2 | 6/2017 | Chung et al. |
| 9,812,063 | B2 | 11/2017 | Lee et al. |
| 9,812,067 | B2 | 11/2017 | Yang et al. |
| 10,083,657 | B2 | 9/2018 | Kim et al. |
| 10,204,551 | B2 | 2/2019 | Zhang |
| 10,354,590 | B2 | 7/2019 | Nie et al. |
| 10,516,013 | B2 | 12/2019 | Han et al. |
| 10,573,699 | B2 | 2/2020 | Park et al. |
| 10,733,931 | B2 | 8/2020 | Jung et al. |
| 10,739,893 | B2 | 8/2020 | Park et al. |
| 11,263,968 | B2 | 3/2022 | Wang et al. |
| 11,322,567 | B2 | 5/2022 | Han et al. |
| 11,424,297 | B2 | 8/2022 | Jian et al. |
| 2011/0279437 | A1 | 11/2011 | Komiya et al. |
| 2016/0125801 | A1 | 5/2016 | Chung et al. |
| 2016/0155381 | A1 | 6/2016 | Kwon et al. |
| 2017/0076654 | A1* | 3/2017 | Wang .................... G09G 3/2074 |
| 2020/0192522 | A1* | 6/2020 | Reynolds ............. H03K 17/941 |
| 2020/0411607 | A1* | 12/2020 | Jian ......................... H10K 59/60 |
| 2021/0065625 | A1* | 3/2021 | Wang .................... G09G 3/3233 |
| 2021/0118370 | A1* | 4/2021 | Shim .................... G09G 3/3233 |

FOREIGN PATENT DOCUMENTS

| | | | |
|---|---|---|---|
| CN | 104715717 | A | 6/2015 |
| CN | 105957473 | A | 9/2016 |
| CN | 106157895 | A | 11/2016 |
| CN | 106205473 | A | 12/2016 |
| CN | 106328061 | A | 1/2017 |
| CN | 106486064 | A | 3/2017 |
| CN | 107967897 | A | 4/2018 |
| CN | 108399890 | A | 8/2018 |
| CN | 109584794 | A | 4/2019 |
| CN | 110310576 | A | 10/2019 |
| CN | 110619813 | A | 12/2019 |
| CN | 110620129 | A | 12/2019 |
| CN | 110660823 | A | 1/2020 |
| KR | 10-2015-0017287 | A | 2/2015 |
| KR | 10-2016-0043593 | A | 4/2016 |
| KR | 10-2016-0055561 | A | 5/2016 |
| KR | 10-2017-0049798 | A | 5/2017 |
| KR | 10-2017-0113066 | A | 10/2017 |
| KR | 10-2018-0045439 | A | 5/2018 |
| KR | 10-2018-0057777 | A | 5/2018 |
| KR | 10-2018-0061573 | A | 6/2018 |
| KR | 10-2019-0095912 | A | 8/2019 |
| TW | 201614629 | A | 4/2016 |
| TW | 201621864 | A | 6/2016 |
| WO | 2015083136 | A1 | 6/2015 |
| WO | 2019242510 | A1 | 12/2019 |

OTHER PUBLICATIONS

International Search Report for International Application No. PCT/KR2020/008762 dated Oct. 21, 2020, 8 pages with Written Opinion and English Translation thereof.
Chinese Office Action corresponding to Application No. 202080092125.5 and issued on Sep. 14, 2024, 10 pages.
Chinese Office Action corresponding to Application No. 202080092125.5 and issued on Feb. 5, 2025, 11 pages.
Chinese Office Action corresponding to Application No. 202080092125.5, dated on Apr. 24, 2025, 9 pages.

* cited by examiner

DISPLAY DEVICE AND OPERATING METHOD THEREFOR

CROSS-REFERENCE TO RELATED APPLICATION(S)

This application is a U.S. national phase application of International Patent Application No. PCT/KR2020/008762, filed on Jul. 3, 2020, which claims priority to Korean Patent Application No. 10-2020-0014331, Feb. 6, 2020, and all the befits accruing therefrom under 35 U.S.C. § 119, the content of which in its entirety is herein incorporated by reference.

BACKGROUND

1. Field

The present Inventive concept relates to a display device and a driving method thereof.

2. Description of the Related Art

As a display device for displaying an image, a flat panel display device including a liquid crystal display panel, a plasma display panel, an organic light emitting diode panel, etc. is mainly used.

A display device such as a smart phone may include at least one display area. The display area, which is a data output area, is an area in which input data may be displayed. In addition, the display area may be provided with a touch sensor to operate as a touch screen. Such a display area is disposed in front of the display device, and may display various types of information.

Recently, a camera, a proximity sensor, a fingerprint sensor, an illuminance sensor, a near-infrared sensor, etc. may be disposed to overlap at least one area of the display area while the display area occupies most of the front surface of the display device such as a smartphone.

In the organic light emitting display panel, a pixel includes a plurality of transistors, a storage capacitor, and an organic light emitting diode. A luminance difference between the pixels may occur due to deviation between the pixels (for example, dispersion of threshold voltages of a driving transistor), and the luminance difference may be viewed as a spot. Various spot compensation algorithms are being researched to correct the spot.

SUMMARY

An object of the present inventive concept is to provide a display device in which degradation of pixels in a display area in which a sensor and the like is overlapped is compensated for.

Another object of the present inventive concept is to provide a driving method of a display device for compensating for degradation of pixels disposed in an area in which a sensor and the like overlaps in a display area.

The objects of the present inventive concept are not limited to the object mentioned above, and other technical objects that are not mentioned may be clearly understood to a person of an ordinary skill in the art using the following description.

An embodiment of the present inventive concept provides a display device including: a display panel including a first display area in which a plurality of first pixels are disposed and a second display area in which a plurality of second pixels are disposed; and at least one sensor overlapping the second display area and not overlapping the first display area of the display panel, wherein the plurality of first pixels and the plurality of second pixels are connected to a scan line providing a scan signal and a data line providing a data signal, and wherein the plurality of first pixels are not connected to a sensing control line providing a sensing control signal that senses an anode voltage of a light emitting element and at least one of the plurality of second pixels are connected to the sensing control line providing a sensing control signal that senses an anode voltage of the light emitting element.

The plurality of second pixels disposed in one direction among the plurality of second pixels may be connected to the same sensing control line.

A density of the first pixels may be greater than that of the second pixels.

A luminance of the plurality of second pixels may be higher than that of the plurality of first pixels for the same gray level.

A density of the plurality of first pixels may be three to five times higher than that of the plurality of second pixels.

The plurality of second pixels may include a transistor that connects the data line and an anode of the light emitting element, a gate electrode of the transistor being connected to the sensing control line.

The number of transistors of each of the plurality of second pixels may be different from that of each of the plurality of first pixels.

The sensor may include a camera.

The second display area may be surrounded by the first display area.

The second display area may include a light emitting area and a transmissive area through which light is transmitted.

The transmissive area may surround the light emitting area.

Another embodiment of the present inventive concept provides a display device including: a scan driver providing a scan signal through scan lines; a data driver providing a data signal through data lines; a sensing controller providing a sensing control signal through sensing control lines; and a display part including a first display area in which a plurality of first pixels are disposed at a first density and a second display area in which a plurality of second pixels are disposed at a second density, wherein the plurality of first pixels and the plurality of second pixels are connected to the scan lines and the data lines, respectively, and wherein the plurality of first pixels are not connected to the sensing control lines and at least one of the plurality of second pixels is connected to a sensing control line among the sensing control lines The plurality of second pixels may include a plurality of pixel rows formed of pixels disposed in one direction, and the plurality of pixel rows may be respectively connected to one sensing control line.

The sensing control signal may be sequentially provided to respective pixel rows.

The sensing controller may be a shift register.

Pixels included in one of the plurality of pixel rows may be connected to different data lines.

Anode voltages of light emitting elements connected to a same data line may be sequentially sensed through a same data line.

An anode voltage of a light emitting element may be sensed through a data line when a sensing control signal having a gate-on voltage is supplied to each of the plurality of second pixels.

The sensing controller may be included in the scan driver.

Another embodiment of the present inventive concept provides a driving method of a display device, wherein the display device includes a first display area in which a plurality of first pixels are disposed at a first density and a second display area in which a plurality of second pixels are disposed at a second density lower than the first density, including: applying a data signal to a sensing pixel of the plurality of second pixels and applying a black voltage to the remaining pixels thereof; and sensing an anode voltage of a light emitting element in the sensing pixel and a variation value of the anode voltage.

The applying the data signal to the sensing pixel of the plurality of second pixels and applying the black voltage to the remaining pixels thereof, and the sensing the anode voltage of the light emitting element in the sensing pixel and the variation value of the anode voltage may be performed in the non-display period during which no image is displayed.

The non-display period may be a period in which the display device is powered off or a period in which the display device waits without displaying an image.

The driving method of the display device may further include comparing the variation value of the anode voltage with a predetermined reference value.

The driving method of the display device may further include initializing the anode voltage before applying the data signal to the sensing pixel.

The applying the data signal and the sensing the anode voltage of the light emitting element may not be performed for the plurality of first pixels.

Particularities of other embodiments are included in the detailed description and drawings.

According to the display devices of the embodiments of the present inventive concept, it is possible to compensate for degradation of a pixel while including the pixel overlapping a sensor and like.

In addition, according to the display devices of the embodiments, it is possible to prevent a boundary between a pixel overlapping a sensor and the like and a pixel not overlapping a sensor and the like from being viewed by a user.

Effects of embodiments of the present inventive concept are not limited by what is illustrated in the above, and more various effects are included in the present specification.

DETAILED DESCRIPTION OF THE EMBODIMENTS

Figure 1:
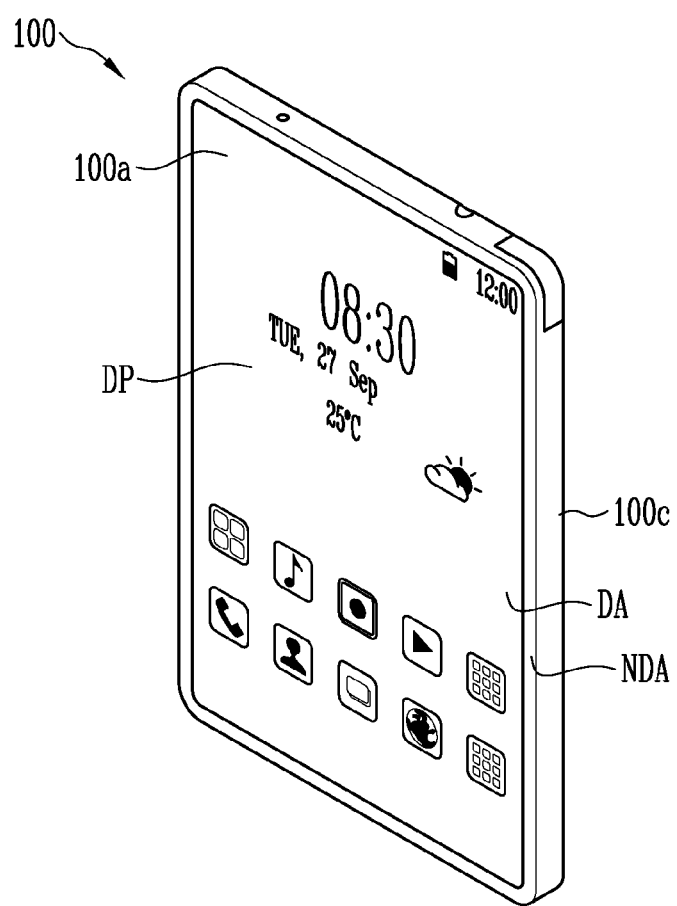
FIG. 1 illustrates a schematic perspective view of a front surface of an electronic device according to various embodiments.

Advantages and features of the present inventive concept and methods of accomplishing the same may be understood more readily by reference to the following detailed description of preferred embodiments and the accompanying drawings. However the present inventive concept is not limited to the embodiments described hereinafter, and may be embodied in many different forms. The following embodiments are provided to make the disclosure of the present inventive concept complete and to allow those skilled in the art to clearly understand the scope of the present inventive concept, and the present inventive concept is defined only by the scope of the appended claims.

It will be understood that when an element or a layer is referred to as being 'on' another element or layer, it can be directly on another element or layer, or intervening element or layer may also be present. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present inventive concept. Singular forms are intended to include plural forms unless the context clearly indicates otherwise.

Hereinafter, embodiments of the present inventive concept will be described in detail with reference to the accompanying drawings. The same or similar reference numerals are used for the same constituent elements on the drawing.

Figure 2:
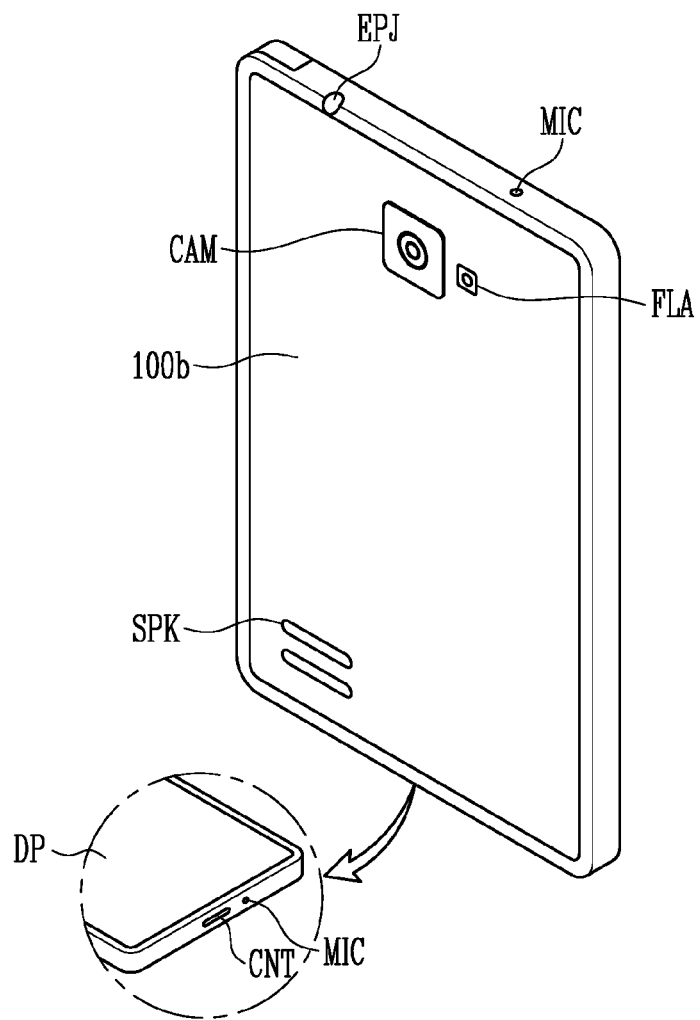
FIG. 2 illustrates a schematic perspective view of a rear surface of the electronic device of FIG. 1.

FIG. 1 illustrates a schematic perspective view of a front surface of an electronic device according to various embodiments. FIG. 2 illustrates a schematic perspective view of a rear surface of the electronic device of FIG. 1.

FIG. 1 illustrates an example in which a main home screen is displayed on a display panel DP of a display device 100 for convenience.

Referring to FIG. 1 and FIG. 2, the display panel DP may be disposed on a front surface 100a of the display device 100 according to the embodiment. The front surface 100a of the display device 100 may include a display area DA in which the display panel DP is disposed to display various data, and a non-display area NDA provided on at least one side of the display area DA.

A rear camera CAM, a flash FLA, a speaker SPK, and the like may be disposed on a rear surface 100b of the display device 100. In addition, for example, a power/reset button, a volume button, a terrestrial DMB antenna for receiving a broadcast, one or a plurality of microphones (MIC), and the like may be disposed on a side surface 100c of the display device 100 according to various embodiments. In addition, a connector CNT may be provided on a lower end side surface of the display device 100. The connector CNT is provided with a plurality of electrodes, and may be connected to an external device by a connecting wire. An earphone connection jack EPJ may be disposed on an upper end side surface of the display device 100.

An element such as a sensor may be disposed inside of the display panel DP of the display device 100 described above, so that the appearance of the front surface 100a may be beautiful, and the wider display area DA may be secured. The element may be an optical element associated with light. For example, the element may be an optical element on which external light is incident or that emits light. The optical element may include, for example, a fingerprint scanner, an image capture device, a strobe, an optical sensor, a proximity sensor, an indicator, or a solar panel.

The display panel DP may be disposed as a large screen to occupy the entire front surface 100a of the display device 100. When the display panel DP is entirely disposed on the front surface 100a of the display device 100, the display device 100 may be substantially called a "full front display". Here, in the "full front display", the entirety of the front surface 100a of the display device 100 may be the display area DA.

The display panel DP described above may be, for example, an organic light emitting display panel. In this case, the display device 100 including the display panel DP may be an organic light emitting display device. In some embodiments, the display panel DP may be a touch screen panel including touch electrodes.

As shown in FIG. 1, a main home screen may be displayed on the display panel DP and the main home screen may be a first screen displayed on the display panel DP when the display device 100 is turned on. A state of the display device 100 such as a battery charging state, a received signal strength, and a current time may be displayed on an upper end portion of the main home screen. The display panel DP may display various contents (for example, a text, an image, a video, an icon, a symbol, etc.) to a user.

Figure 3:
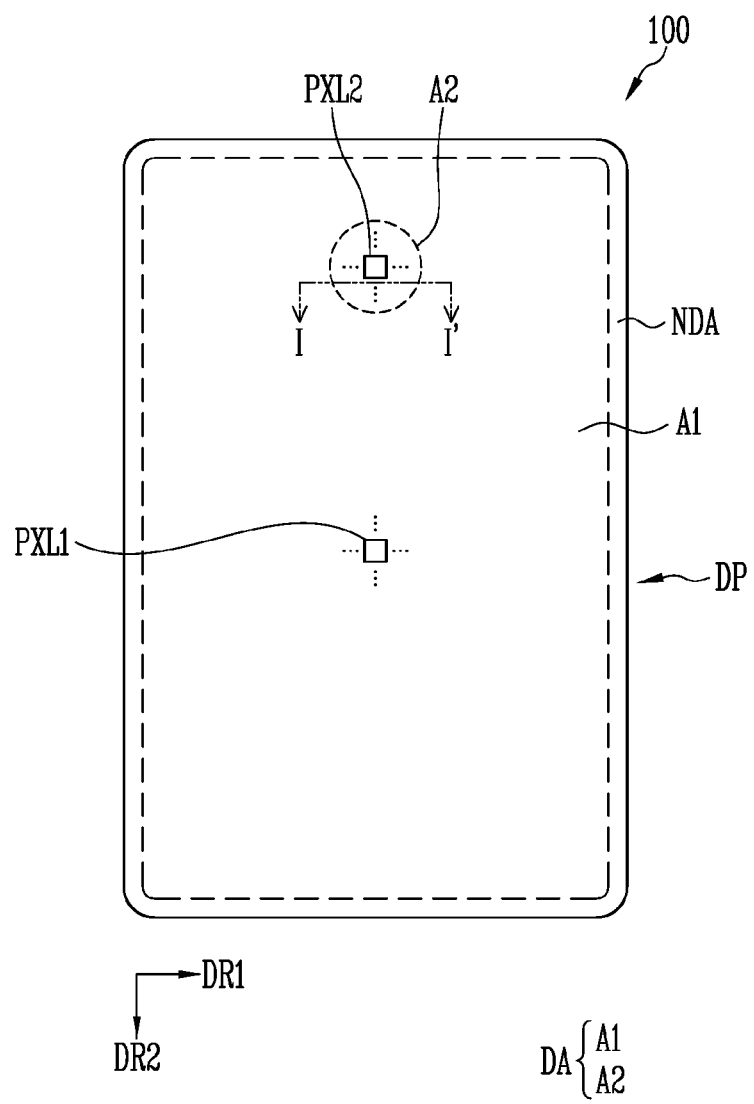
FIG. 3 illustrates a schematic top plan view of a display device according to an embodiment of the present inventive concept.
Figure 4:
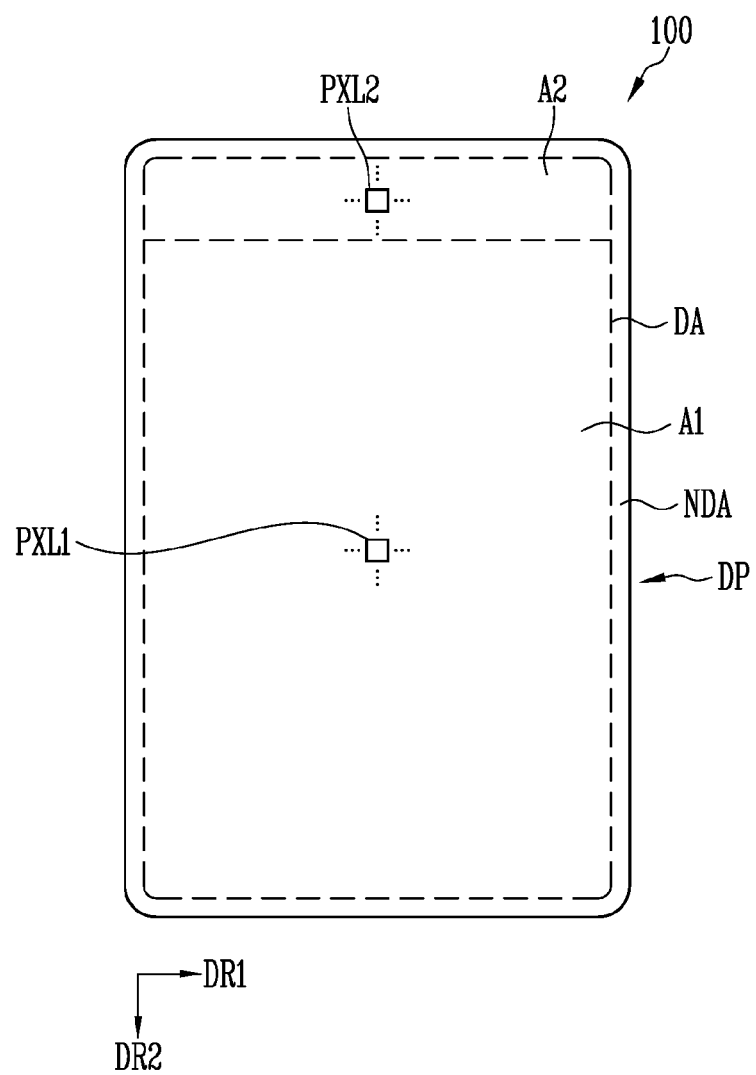
FIG. 4 and FIG. 5 illustrate modifications of FIG. 3.
Figure 5:
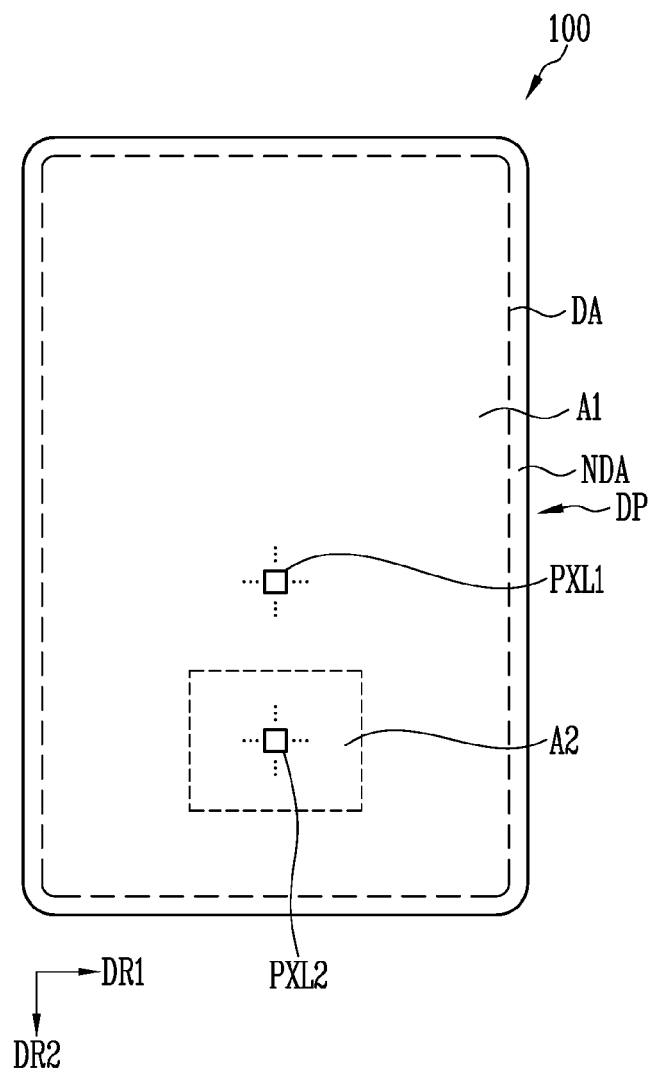
Figure 6:
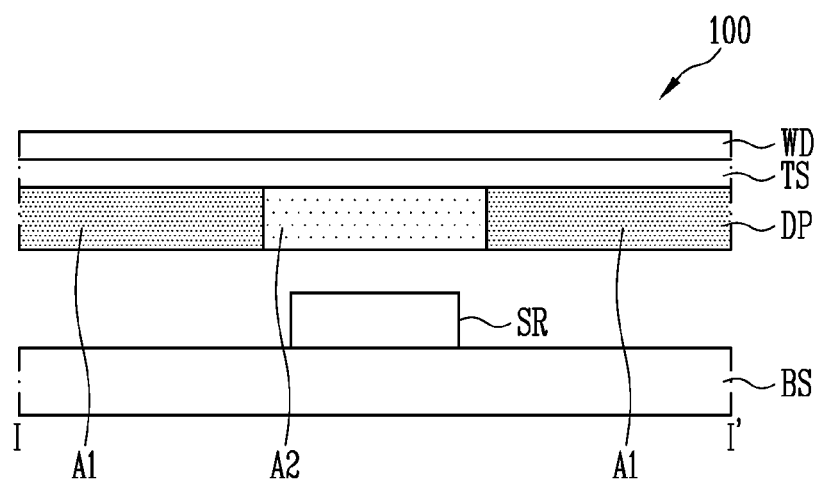
FIG. 6 illustrates a cross-sectional view taken along line I-I' of FIG. 3.

FIG. 3 illustrates a schematic top plan view of a display device according to an embodiment of the present inventive concept. FIG. 4 and FIG. 5 illustrate modifications of FIG. 3. FIG. 6 illustrates a cross-sectional view taken along line I-I' of FIG. 3.

Referring to FIG. 1 to FIG. 6, the display device 100 may have flexibility in the whole or at least a portion thereof. For example, the display device 100 may have flexibility in an entire area thereof, or may have flexibility in an area corresponding to the flexible area. When the entirety of the display device 100 is flexible, the display device 100 may be a rollable display device, and when a portion of the display device 100 is flexible, the display device 100 may be a foldable display device, but the present inventive concept is not limited thereto.

In the embodiment of the present inventive concept, the display device 100 may include the display panel DP, a touch sensor TS, a window WD, and at least one sensor SR.

The display panel DP may be disposed on the front surface of the display device 100.

The display panel DP displays arbitrary visual information, for example, a text, a video, a photographic two-dimensional or three-dimensional image, etc. on the front surface (for example, an image display surface). A type of display panel DP is not particularly limited to a specific display panel. In the embodiment, as the display panel DP, a display panel capable of self-luminous, such as an organic light emitting display panel (OLED panel), may be used. In addition, in another embodiment, as the display panel DP, a non-emissive display panel such as a liquid crystal display panel (LCD panel), an electro-phoretic display panel (EPD panel), and an electro-wetting display panel (EWD panel) may be used. When the non-emissive display panel is used as the display panel DP of the display device 100 according to the embodiment, the display device 100 may include a backlight unit that supplies light to the display panel DP. In the present embodiment, an example in which the display panel DP is an organic light emitting display panel will be described. However, the type of the display panel DP is not limited thereto, and other display panels may be used within a range (or limit) suitable for the concept of the present inventive concept. In the embodiment of the present inventive concept, the display panel DP may have the same configuration as the display panel DP included in the display device 100 illustrated in FIG. 1.

In the display area DA, a plurality of pixels PXL1 and PXL2 may be disposed. In some embodiments, each of the pixels PXL1 and PXL2 may include at least one light emitting element. In the embodiment, the light emitting element may be an organic light emitting diode. In another embodiment, the light emitting element may be a light emitting unit including an ultra-small inorganic light emitting diode having a size in a micro to nano scale range. The display panel DP may display an image in the display area DA by driving the pixels PXL1 and PXL2 in response to input image data. The display area DA may be disposed as a large screen to occupy most of the front surface of the display device 100.

The non-display area NDA is an area surrounding at least one side of the display area DA, and it may be a remaining area except the display area DA. In some embodiments, the non-display area NDA may include a wire area, a pad area, and/or various dummy areas.

In the embodiment of the present inventive concept, the display area DA may be disposed on most of the front surface of the display device 100 as shown in FIG. 3 to FIG. 5. However, the display area DA may be disposed on the entire front surface of the display device 100. As the display area DA is disposed on the entire front surface of the display device 100, the non-display area NDA may not be disposed on the front surface. For example, the display area DA may be in contact with a side edge of the display device 100, or may be disposed to be at a predetermined distance from the side edge. In FIG. 3 to FIG. 5, the display area DA is illustrated as being disposed only on the front surface of the display device 100, but the present inventive concept is not limited thereto. In some embodiments, the display area DA may be disposed on at least one portion of the side edge of the display device 100 or on at least one portion of the rear surface of the display device 100. The display areas DA disposed on the plurality of surfaces of the display device 100 may be combined with or separated from each other in at least a position.

In the embodiment of the present inventive concept, the display device 100 may include at least one sensor SR disposed to overlap at least a portion of the display area DA. The sensor SR may be disposed under the pixels PXL1 and PXL2 and/or wires disposed in the display area DA not to be recognized by the user when viewed from the front surface of the display device 100. When the sensor SR is disposed to overlap a lower portion of the display area DA, an appearance of the display device 100, particularly, an appearance of the front surface corresponding to the display area DA is beautiful, thereby securing a wider display area DA.

In the embodiment of the present inventive concept, the display area DA may include a first display area A1 and a second display area A2. The first display area A1 is defined as an area that does not overlap the sensor SR, and the second display area A2 is defined as an area that overlaps the sensor SR. In some embodiments, the first display area A1 may be set to have a larger size (or area) than that of the second display area A2.

As shown in FIG. 3 and FIG. 5, the second display area A2 is disposed inside the display area DA, and it may be surrounded by the first display area A1. In FIG. 3, it is illustrated that the second display area A2 has a substantially circular shape, but the present inventive concept is not limited thereto. In some embodiments, the second display area A2 may have a polygonal shape including a quadrangular shape as shown in FIG. 5, and may have various shapes such as an ellipse. In addition, a plurality of second display areas A2 may be disposed in the display area DA.

As shown in FIG. 4, the display area DA may include the first display area A1 and the second display area A2 disposed adjacent to the first display area along a second direction DR2. In some embodiments, the second display area A2 may be provided (or set) to have a wider area than an area overlapping the sensor SR. For example, the second display area A2 may be disposed at one side of the first display area A1 (for example, an upper end portion) of the display device 100 as shown in FIG. 4. In FIG. 4, at least one second display area A2 is illustrated as being disposed only at an upper end portion of the front surface of the display device 100, but the present inventive concept is not limited thereto. In some embodiments, one or more second display areas A2 may be disposed adjacent to each other or dispose to be separated each other in the display area DA. For example, in the embodiment in which the display area DA is formed on the side edge and/or the rear surface of the display device 100, some of the second display areas A2 may be formed at the side edge and/or on the rear surface of the display device 100.

The sensor SR disposed to overlap the second display area A2 may be an optical element. That is, the sensor SR may be an element that receives or emits light. The sensor SR may include, for example, a fingerprint sensor, an image sensor, a camera, a strobe, an optical sensor, an illuminance sensor, a proximity sensor, an RGB sensor, an infrared sensor, an indicator, a solar panel, and the like. However, the sensor SR is not limited to an optical element, and it may include various elements such as an ultrasonic sensor, a microphone, an environmental sensor (for example, a barometer, a hygrometer, a thermometer, a radiation sensor, a thermal sensor, etc.), and a chemical sensor (for example, a gas detection sensor, a dust detection sensor, an odor detection sensor, etc.). In the embodiment of the present inventive concept, the sensor SR may include a plurality of sensors overlapping the second display area A2. Here, the plurality of sensors may include a camera, a proximity sensor, and an illuminance sensor disposed side by side.

The sensor SR may be disposed to face (or correspond to) at least one area of the display area DA, for example, the display area A2, by using a surface mount device (SMD) method on a separate base substrate BS made of a plastic or metal material such as a bracket or a case.

The second display area A2 may transmit a signal (for example, light) to the sensor SR. In order to improve transmittance of the signal, transmittance of the second display area A2 may be higher than that of the first display area A1. Here, the transmittance means an extent to which light is transmitted per unit area (or a predetermined area or the same area). For example, the transmittance may be a ratio of light transmitted through the display panel DP with respect to light incident on the unit area of the display panel DP. Therefore, the second display area A2 having a relatively high transmittance may transmit a signal (for example, light) better than the first display area A1.

Hereinafter, a pixel disposed in the first display area A1 is defined as a first pixel PXL1 and a pixel disposed in the second display area A2 is defined as a second pixel PXL2.

For example, the second pixels PXL2 in the second display area A2 may be disposed at a lower density per unit area than the first pixels PXL1 in the first display area A1. An area disposed between adjacent second pixels PXL2 *d* may better transmit a signal (for example, light) by forming a physical and/or optical aperture, for example, a transmissive window.

The touch sensor TS and the window WD may be disposed on the display panel DP including the above-described elements.

The touch sensor TS includes touch electrodes. The touch sensor TS is disposed on an image display surface of the display panel DP to receive a user's touch input and/or a hover input. The touch sensor TS may recognize the touch input and/or the hover input of the display device 100 by detecting touch capacitance by contact and/or proximity of a separate input member (for example, an electronic pen) such as a user's finger or a conductor similar thereto. In this case, the touch input means an input that is directly touched (or contacted) the display device 100 by the user's finger or a separate input member, and the hover input means an input that is not directly touched (or contacted) the display device 100 by the user's hand or the separate input member but the user's hand or the separate input member is near the display device 100 including the touch sensor TS.

In addition, the touch sensor TS may detect a user's touch operation and helps to move an object displayed on the display device 100 from an originally displayed position to another position in response to the touch operation. Here, the touch operation may include at least one of one single touch, multiple touches, and a touch gesture. For example, there may be various touch operations including a specific gesture such as enlarging or reducing a text or an image by making a user's finger move by a predetermined distance while the user's finger is touched on a touch surface of the touch sensor TS.

The window WD is a member disposed on an uppermost end portion of the display device 100 including the display panel DP. The window WD may be a transparent substrate. The window WD transmits an image from the display panel DP and mitigates an external impact, thereby preventing the display panel DP from being damaged or malfunctioning due to an external impact. Here, the external impact may be a force from the outside that may be expressed by pressure, stress, or the like, and may mean a force that may cause a defect in the display panel DP. The window WD may include a rigid or flexible substrate, and a material of the window WD is not particularly limited.

Figure 7:
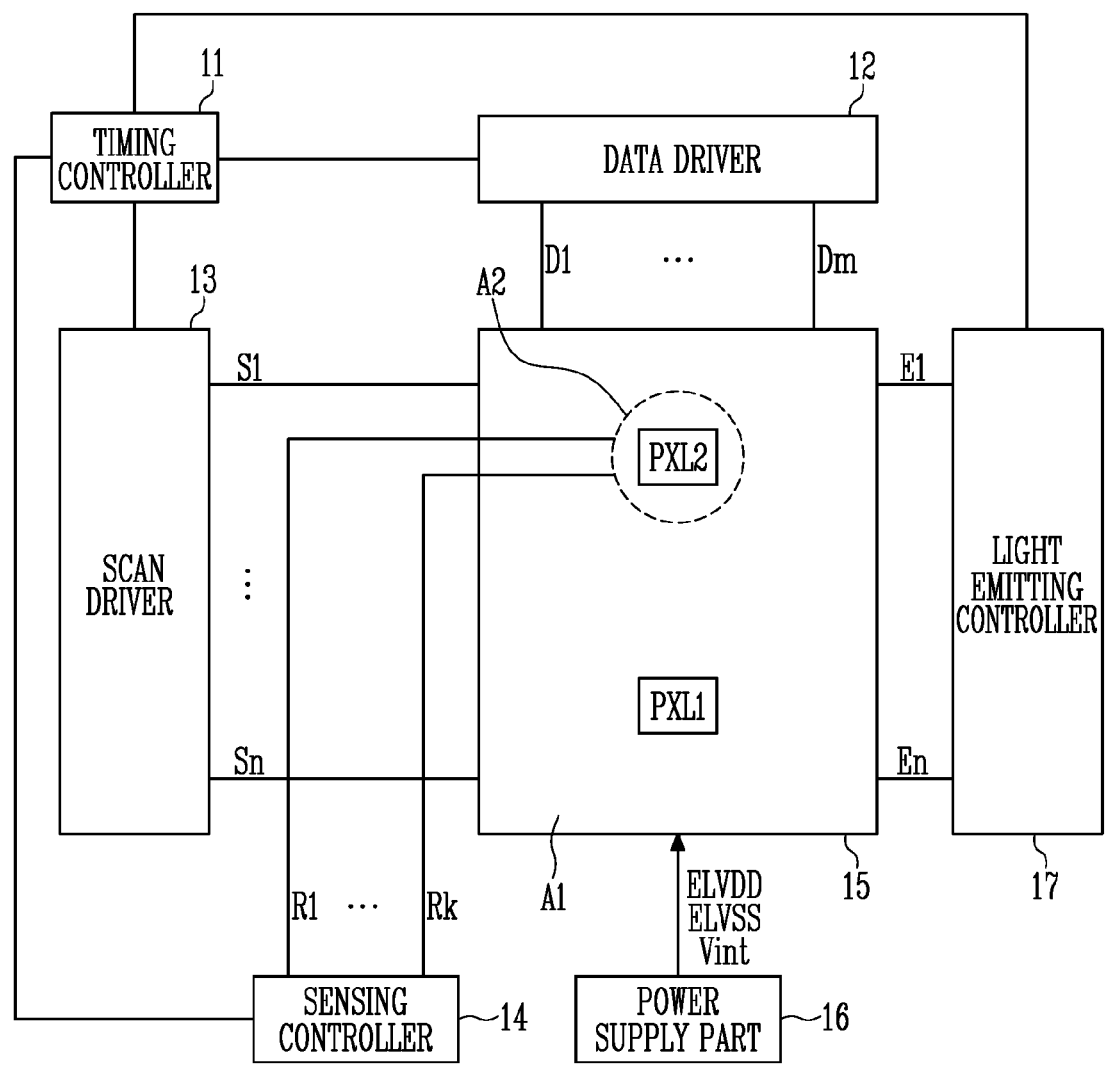
FIG. 7 illustrates a schematic block diagram of a display device according to an embodiment of the present inventive concept.
Figure 8:
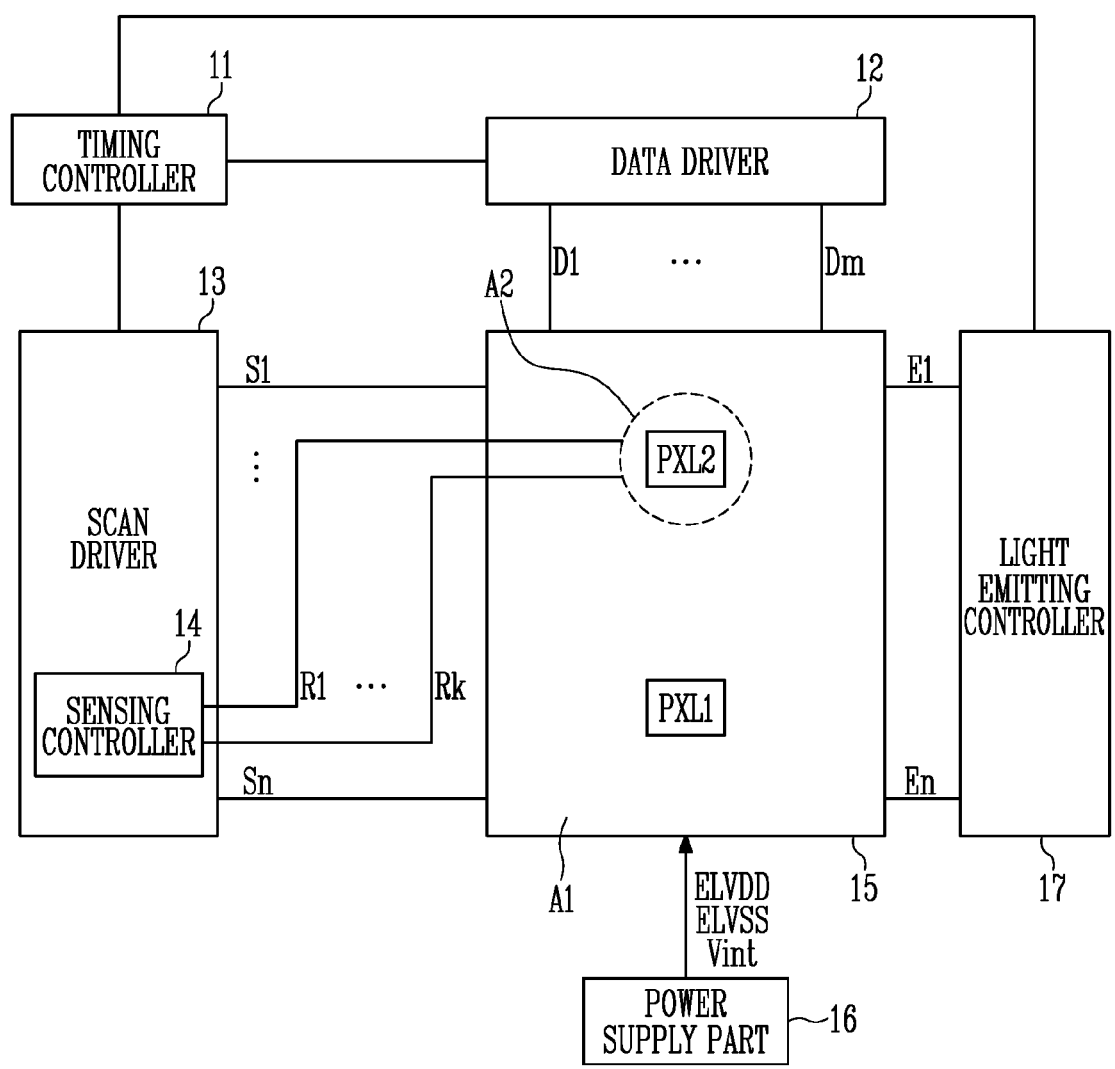
FIG. 8 illustrates a modification of FIG. 7.

FIG. 7 illustrates a schematic block diagram of a display device according to an embodiment of the present inventive concept. FIG. 8 illustrates a modification of FIG. 7.

Referring to FIG. 7 and FIG. 8, the display device 100 according to the embodiment of the present inventive concept may include a timing controller 11, a data driver 12, a scan driver 13, a sensing controller 14, a display part 15, a power supply part 16, and a light emitting controller 17.

The timing controller 11 may provide grayscale values, a control signal, and the like for each frame to the data driver 12. In addition, the timing controller 11 may provide a clock signal, a control signal, and the like to the scan driver 13 and the sensing controller 14, respectively.

The data driver 12 may generate data voltages to be provided to data lines D1 to Dm by using grayscale values and a control signal received from the timing controller 11. For example, the data driver 12 may sample the grayscale values in response to a clock signal and apply the data voltages corresponding to the grayscale values to the data lines D1 to Dm one pixel row (for example, pixels connected to the same scan line) at a time. m may be a natural number.

Meanwhile, the data driver 12 may measure degradation information of the pixels PXL1 and PXL2 using the received current or voltage. For example, the degradation information of the pixels PXL1 and PXL2 may be mobility information of driving transistors, threshold voltage information of the driving transistor, degradation information of the light emitting element, and the like. In addition, the data driver 12 may measure some characteristic information of at least some of the pixels (for example, PXL2) according to an environment using currents or voltages received through receiving lines R1 to Rk. For example, the data driver 12 may measure changed characteristic information of the pixels PXL1 and PXL2 according to a temperature or a humidity.

The scan driver 13 may receive a clock signal, a control signal, and the like from the timing controller 11 to generate scan signals to be provided to scan lines S1 to Sn. For example, the scan driver 13 may sequentially provide the scan signals having pulses of a gate-on (turn-on) level to the scan lines S1 to Sn. For example, the scan driver 13 may generate the scan signals by sequentially transmitting carry signals having a gate-on level pulse to next stages according to the clock signal. n may be a natural number. For example, the scan driver 13 may be a shift register. The above-described scan signals may be provided to the pixels PXL1 and PXL2 connected to the scan lines S1 to Sn.

However, the above-described operation of the scan driver 13 is related to an operation in a display period in which the display device 100 displays an image, and it is distinct from an operation in a compensation period included in a non-display period in which an image is not displayed. Here, the display period corresponds to a period in which a data voltage is supplied to the first and second pixels PXL1 and PXL2 to display an input image on a screen, and the compensation period corresponds to a period in which a black data voltage is input to the second pixels PXL2, initialized, sensed, and the black data voltage is input again. The compensation period may be a period for performing external compensation.

The sensing controller 14 may receive a clock signal, a control signal, and the like from the timing controller 11 to generate sensing control signals to be provided to sensing control lines R1 to Rk. For example, the sensing controller 14 may sequentially provide sensing control signals having pulses of a gate-on level to the sensing control lines R1 to Rk. For example, the sensing controller 14 may generate the sensing control signals by sequentially transmitting carry signals having pulses of a gate-on level to next stages according to the clock signal. k may be a natural number smaller than n. For example, the sensing controller 14 may be a shift register. The sensing control signals described above may be provided to at least some of the pixels (for example, PXL2) connected to the sensing control lines R1 to Rk.

In the embodiment, the sensing control lines R1 to Rk may be connected to the second pixels PXL2, but may not be connected to the first pixels PXL1. That is, the second pixels PXL2 may be connected to the sensing control lines R1-Rk, but the first pixels PXL1 may not be connected to the sensing control lines R1-Rk. In some embodiments, at least one of the second pixels PXL2 may be connected to the scan lines S1 to Sn, the data lines D1 to Dm, and the sensing control lines R1 to Rk, and the first pixels PXL1 may be connected to the scan lines S1 to Sn and the data lines D1 to Dm.

In the embodiment, the sensing control lines R1 to Rk may substantially extend in the same direction as the scan lines S1 to Sn extends in the display part 15. The second pixels PXL2 (or sub-pixels, see FIG. 12) included in the same pixel row may be connected to the same sensing control line. However, the second pixels PXL2 (or sub-pixels, see FIG. 12) included in the same pixel row may be connected to different data lines D1 to Dm.

Although the sensing controller 14 is illustrated as being separate from the scan driver 13 in FIG. 7, the sensing controller 14 may be included in the scan driver 13 as shown in FIG. 8. In the case of FIG. 8, the scan driver 13 may include the sensing controller 14 described above. For example, the scan driver 13 may provide scan signals to the scan lines S1 to Sn and provide sensing control signals to the sensing control lines R1 to Rk.

The light emitting controller 17 may receive a clock signal, a light emitting stop signal, and the like from the timing controller 11 to generate light emitting signals to be provided to light emitting control lines E1 to En. For example, the light emitting controller 17 may sequentially provide light emitting signals having pulses of a gate-off level to the light emitting control lines E1 to En. For example, the light emitting controller 17 may be a shift register and may generate light emitting signals by sequentially transmitting pulses of a gate-off level of the light emitting stop signal to a next stage circuit according to control of the clock signal.

The display part 15 includes the pixels PXL1 and PXL2. The display part 15 may define the display area DA. That is, as the display area DA described above, the display part 15 may define the first display area A1 in which the first pixels PXL1 are disposed and the second display area A2 in which the second pixels PXL2 are disposed.

In the embodiment, each first pixel PXL1 may be connected to a data line Dj (see FIG. 10), scan lines (Si−1, Si, Si+1; see FIG. 10), and a light emitting control line Ei (see FIG. 10) that correspond thereto. Each second pixel PXL2 may be connected to a data line Dq (see FIG. 16), scan lines Sp−1, Sp, Sp+1 (see FIG. 16), a light emitting control line Ep (see FIG. 16), and a sensing control line Rr (see FIG. 16) which correspond to each second pixel PXL2.

The power supply part 16 may receive an external input voltage and provide a power voltage to an output terminal by converting the external input voltage. For example, the power supply part 16 generates a high power voltage ELVDD and a low power voltage ELVSS based on the external input voltage. In the present specification, the high power voltage ELVDD may have a voltage level higher than that of the low power voltage ELVSS. The power supply part 16 may provide an initializing voltage Vint for initializing the gate electrode of the driving transistor or the anode of the light emitting element OLED (see FIG. 10 and FIG. 16) for each of the pixels PXL1 and PXL2.

The power supply part 16 may receive an external input voltage from a battery or the like, and boost the external input voltage to generate a power voltage that is higher than the external input voltage. For example, the power supply part 16 may be a power management integrated chip (PMIC). For example, the power supply part 16 may be an external DC/DC IC.

Figure 9:
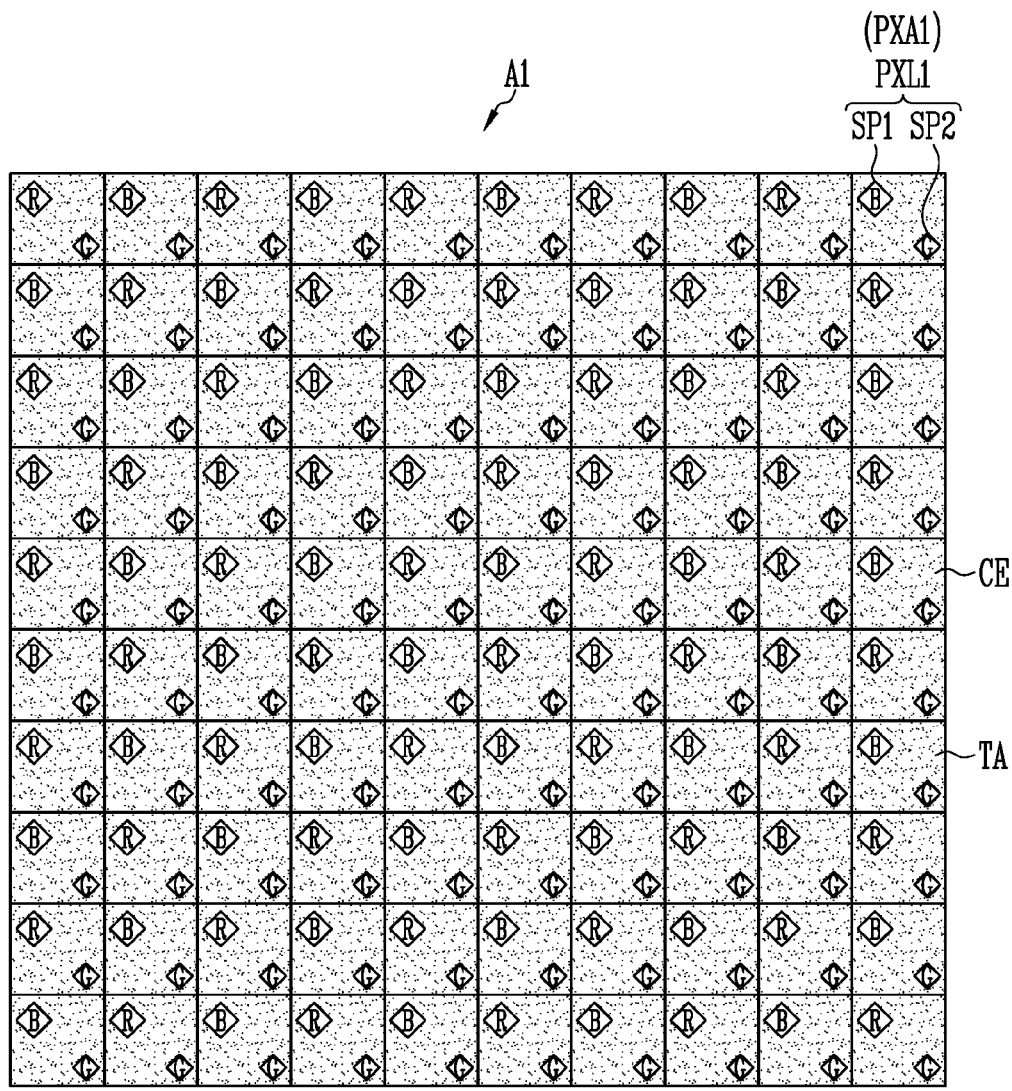
FIG. 9 illustrates a schematic top plan view of a first display area according to an embodiment of the present inventive concept.
Figure 10:
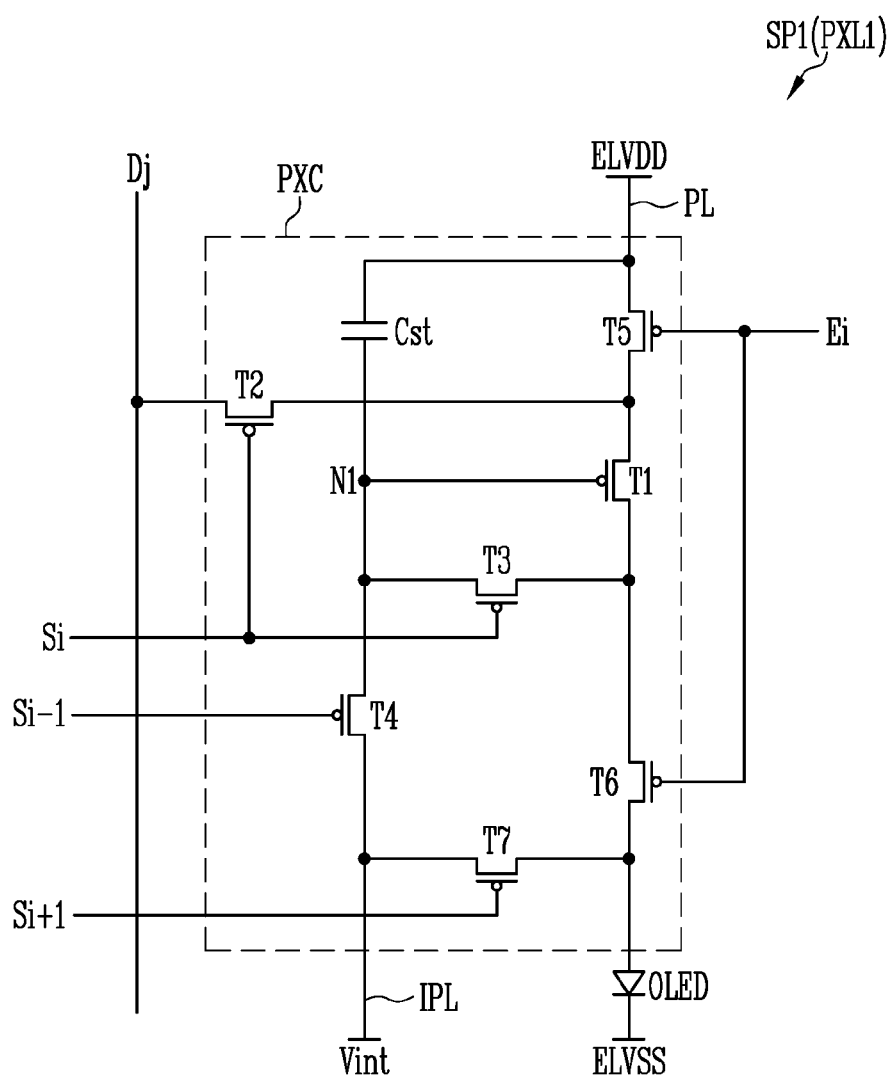
FIG. 10 illustrates a circuit diagram of an electrical connection relationship between constituent elements included in a first sub-pixel of FIG. 9.

FIG. 9 illustrates a schematic top plan view of a first display area according to an embodiment of the present inventive concept. FIG. 10 illustrates a circuit diagram of an electrical connection relationship between constituent elements included in a first sub-pixel of FIG. 9.

In FIG. 10, one active sub-pixel, for example, a first sub-pixel SP1 of FIG. 9, which is connected to an i-th scan line Si and an i-th light emitting control line Ei disposed in an i-th horizontal pixel row of the first display area A1, and is connected to an j-th data line Dj disposed in an j-th vertical pixel column thereof, and includes seven transistors, is illustrated.

Referring to FIG. 1 to FIG. 10, the first display area A1 is one area of the display area DA and a plurality of first pixels PXL1 may be disposed therein.

Each first pixel PXL1 may include at least one sub-pixel. For example, the first pixel PXL1 may include two sub-pixels SP1 and SP2. The first sub-pixel SP1 may be a red pixel R emitting red light or a blue pixel B emitting blue light, and the second sub-pixel SP2 may be a green pixel G emitting green light. However, the present inventive concept is not limited thereto, and in some embodiments, the first sub-pixel SP1 may be a green pixel G emitting green light and the second sub-pixel SP2 may be a blue pixel B emitting blue light. In the present embodiment, for convenience of description, it is illustrated that each of the pixels PXL1 and PXL2 includes two sub-pixels SP1 and SP2, but the first pixel PXL1 may include four sub-pixels including one red pixel R, one blue pixel B, and two green pixels G.

The first sub-pixel SP1 including the red pixel R and the first sub-pixel SP1 including the blue pixel B are alternately arranged in a second direction DR2, for example, in a vertical direction or a column direction to form a first pixel column. That is, the first sub-pixel SP1 including the red pixel R and the first sub-pixel SP1 including the blue pixel B may be alternatingly disposed in the first pixel column. The second sub-pixel SP2 including the green pixel G may be disposed in the second direction DR2 to form a second pixel column. That is, the second sub-pixel SP2 each including the green pixel G are disposed in the second pixel column.

In the embodiment of the present inventive concept, the arrangement order of the pixels of the first pixel column may be different from each other. For example, one of first pixel columns may be disposed in the order of the first sub-pixel SP1 including the red pixel R, the first sub-pixel SP1 including the blue pixel B, the first sub-pixel SP1 including the red pixel R, and the first sub-pixel SP1 including the blue pixel B, . . . , and the other of the first pixel columns disposed adjacent to the one of the first pixel columns may be disposed in the order of the first sub-pixel SP1 including the blue pixel B, the first sub-pixel SP1 including the red pixel R, the first sub-pixel SP1 including the blue pixel B, and the first sub-pixel SP1 including the red pixel R, . . . .

A plurality of the first pixel columns and a plurality of the second pixel columns may be alternately disposed along a first direction DR1, for example, along a horizontal direction or a row direction.

In the first display area A1, two first sub-pixels SP1 including the red pixel R and two first sub-pixels SP1 including the blue pixel B may be disposed in a diagonal direction with respect to one second sub-pixel SP2 including the green pixel G. For example, based on one second sub-pixel SP2, two first sub-pixels SP1 including the blue pixel B may be disposed in a third direction DR3 (for example, a direction inclined to the first direction DR1), and two first sub-pixels SP1 including the red pixel R may be disposed in a fourth direction DR4 (for example, a direction inclined to the second direction DR2).

Two first sub-pixels SP1 including the red pixel R and two first sub-pixels SP1 including the blue pixel B may face each other with one second sub-pixel SP2 including the green pixel G in a center thereof. Each of the first and second sub-pixels SP1 and SP2 may have a rhombus structure, and the first and second sub-pixels SP1 and SP2 are formed to have the same area or a similar area to each other. However, the present inventive concept is not limited thereto, and the first and second sub-pixels SP1 and SP2 may have different structures, and light emitting areas (or sizes) of some of the first and second sub-pixels SP1 and SP2 may be smaller or larger than those of the remaining sub-pixels. In FIG. 9, for convenience, it illustrated that the first sub-pixel SP1 and the second sub-pixel SP2 have different areas (or sizes).

In the embodiment of the present inventive concept, the first display area A1 may include a first pixel area PXA1 in which each first pixel PXL1 is disposed. That is, a plurality of first pixel areas PXA1 may be disposed in the first display area A1. A predetermined number of the first pixel areas PXA1 may be arranged along the first direction DR1 and the second direction DR2 according to a resolution of the display panel DP. Color light and/or white light may be implemented by a combination of sub-pixels included in each first pixel area PXA1.

In the first display area A1, the first pixels PXL1 including the first and second sub-pixels SP1 and SP2, respectively, may be disposed at a first density. Here, the first density may be defined as pixels per inch (PPI) of the first pixels PXL1 per unit area of the first display area A1. Meanwhile, according to the embodiment, the first pixels PXL1 are densely disposed in the first display area A1 such that an entire area of the first display area A1 and an area in which the first pixels PXL1 are disposed are substantially the same, or the first pixels PXL1 are sparsely disposed in the first display area A1 such that the area in which the first pixels PXL1 are disposed may be extremely small compared to the entire area of the display area A1.

Each of the first and second sub-pixels SP1 and SP2 may include a pixel circuit including a light emitting element emitting light and at least one transistor for driving the light emitting element. The pixel circuits of respective first and second sub-pixels SP1 and SP2 may have a substantially similar or identical structure. Accordingly, for better comprehension and ease of description, the pixel circuit of each of the first and second sub-pixels SP1 and SP2 will be described with reference to the pixel circuit PXC of the first sub-pixel SP1 of FIG. 10.

As shown in FIG. 10, the first sub-pixel SP1 of the first pixel PXL1 may include a light emitting element OLED and a pixel circuit PXC connected to the light emitting element OLED to drive the light emitting element OLED. Here, the pixel circuit PXC may include first to seventh transistors T1 to T7, the light emitting element OLED, and a storage capacitor Cst. However, in the present inventive concept, the elements included in the pixel circuit PXC of the first sub-pixel SP1 are not limited to the above-described embodiment.

A first electrode of the first transistor T1 (driving transistor) may be connected to the first power source ELVDD via the fifth transistor T5 and the second electrode thereof may be connected to the anode of the light emitting element OLED via the sixth transistor T6. A gate electrode of the first transistor T1 may be connected to a first node N1. The first transistor T1 may control an amount of a current flowing from the first power source ELVDD to the second power source ELVSS via the light emitting element OLED in response to a voltage of the first node N1.

The second transistor T2 (switching transistor) may be connected between a j-th data line Dj and the first electrode of the first transistor T1. A gate electrode of the second transistor T2 may be connected to an i-th scan line Si. When a scan signal is supplied to the i-th scan line Si, the second transistor T2 may be turned on to electrically connect the j-th data line Dj to the first electrode of the first transistor T1.

The third transistor T3 may be connected between a second electrode of the first transistor T1 and the first node N1. A gate electrode of the third transistor T3 may be connected to the i-th scan line Si. When the scan signal of a gate-on voltage is supplied to the i-th scan line Si, the third transistor T3 may be turned on to electrically connect the second electrode of the first transistor T1 and the first node N1. Accordingly, when the third transistor T3 is turned on, the first transistor T1 may be diode-connected.

The fourth transistor T4 (initializing transistor) may be connected between the first node N1 and an initializing power line IPL to which the initializing power source Vint is applied. A gate electrode of the fourth transistor T4 may be connected to an (i−1)-th scan line Si−1. When the scan signal is supplied to the (i−1)-th scan line Si−1, the fourth transistor T4 may be turned on to supply a voltage of the initializing power source Vint to the first node N1.

The fifth transistor T5 may be connected between a power line PL to which the first power source ELVDD is applied and the first electrode of the first transistor T1. A gate electrode of the fifth transistor T5 may be connected to an i-th light emitting control line Ei. When a light emitting control signal of a gate-off voltage is supplied to the i-th emission control line Ei, the fifth transistor T5 may be turned off, and otherwise it may be turned on.

The sixth transistor T6 may be connected between the second electrode of the first transistor T1 and the light emitting element OLED. A gate electrode of the sixth transistor T6 may be connected to the i-th light emitting control line Ei. When the light emitting control signal (for example, a high level voltage) having a gate-off voltage is supplied to the i-th light emitting control line Ei, the sixth transistor T6 may be turned off, and otherwise it may be turned on.

The seventh transistor T7 may be connected between the initializing power line IPL to which the initializing power source Vint is applied and the first electrode of the light emitting element OLED, for example, the anode thereof. A gate electrode of the seventh transistor T7 may be connected to an (i+1)-th scan line Si+1. When a scan signal of a gate-on voltage (for example, a low level voltage) is supplied to the (i+1)-th scan line Si+1, the seventh transistor T7 is turned on to supply a voltage of the initializing power source Vint to the anode of the light emitting element OLED. Here, the voltage of the initializing power source Vint may be set to a voltage lower than the data signal. That is, the voltage of the initializing power source Vint may be set to be equal to or less than the lowest voltage of the data signal.

The storage capacitor Cst may be connected between the power line PL to which the first power source ELVDD is applied and the first node N1. The storage capacitor Cst may store a voltage corresponding to the data signal and a threshold voltage of the first transistor T1.

The anode of the light emitting element OLED may be connected to the first transistor T1 via the sixth transistor T6 and the cathode thereof may be connected to the second power source ELVSS. The light emitting element OLED generates light having a predetermined luminance corresponding to an amount of current supplied from the first transistor T1. A voltage value of the first power source ELVDD may be set higher than that of the second power source ELVSS so that a current flows to the light emitting element OLED.

The light emitting element OLED may be, for example, an organic light emitting diode. The light emitting element OLED may emit light of one of red, green, and blue. However, the present inventive concept is not limited thereto.

On the other hand, the structure of the first sub-pixel SP1 is not limited to the embodiment shown in FIG. 10. For example, the pixel circuits PXC having various structures currently known may be applied to the first sub-pixel SP1.

Figure 11:
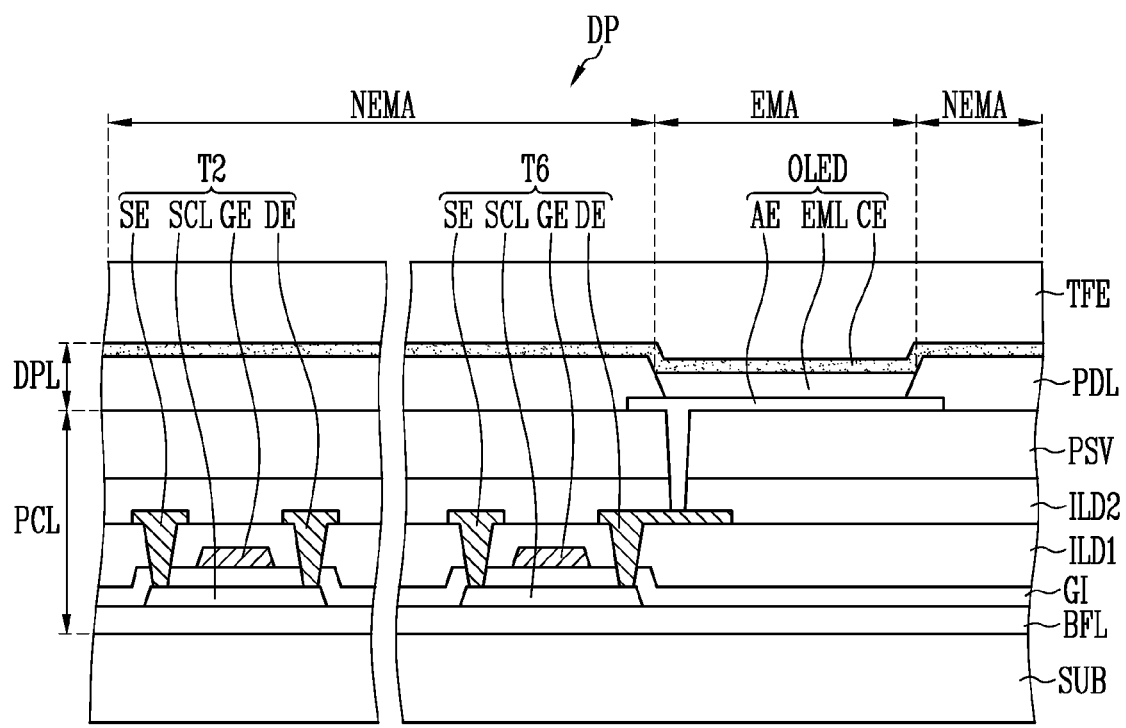
FIG. 11 illustrates a schematic cross-sectional view of the first sub-pixel of FIG. 9.

FIG. 11 illustrates a schematic cross-sectional view of the first sub-pixel of FIG. 9.

In FIG. 11, for better comprehension and ease of description, only a cross section of a portion corresponding to each of the second and sixth transistors T2 and T6 among the first to seventh transistors T1 to T7 illustrated in FIG. 10 is shown.

Referring to FIGS. 1 to 11, the display panel DP may include a substrate SUB, a pixel circuit portion PCL, a display element portion DPL, and a thin film encapsulation film TFE.

The substrate SUB may include a transparent insulating material to transmit light. The substrate SUB may have a single layered structure or a multi layered structure.

The substrate SUB may be a rigid substrate. For example, the rigid substrate may be one of a glass substrate, a quartz substrate, a glass ceramic substrate, and a crystalline glass substrate.

In addition, the substrate SUB may be a flexible substrate. Here, the flexible substrate may be one of a film substrate and a plastic substrate, which include a polymer organic material. For example, the flexible substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material forming the substrate SUB is not limited to the above-described embodiment, and may be variously changed.

The pixel circuit portion PCL may include a pixel circuit PXC including at least one insulating film and at least one transistor. The display element portion DPL may include at least one light emitting element OLED that emits light.

The pixel circuit portion PCL may include insulating films and the second and sixth transistors T2 and T6 disposed on the substrate SUB. Here, the insulating films may include a buffer film BFL, a gate insulating film GI, first and second interlayer insulating films ILD1 and ILD2, and a passivation film PSV sequentially stacked on the substrate SUB.

The buffer film BFL is provided on the substrate SUB, and it may prevent impurities from being diffused into the second and sixth transistors T2 and T6. In the present specification, the term "provided" may be interpreted as "disposed". The buffer film BFL may include an inorganic insulating film including an inorganic material. For example, the buffer film BFL may include at least one of metal oxides such as a silicon nitride (SiNx), a silicon oxide (SiOx), a silicon oxynitride (SiON), and AlOx. The buffer film BFL may be provided as a single film, but may be provided as a multi-film of at least two or more layers. When the buffer film BFL is provided as the multi-film, respective layers thereof may be made of the same material or different materials. The buffer film BFL may be omitted depending on the material, a process condition, and the like of the substrate SUB.

Each of the second and sixth transistors T2 and T6 may include a semiconductor layer SCL, a gate electrode GE, a first terminal SE, and a second terminal DE. The first terminal SE may be one of a source electrode and a drain electrode, and the second terminal DE may be the other of the source electrode and the drain electrode. For example, when the first terminal SE is the source electrode, the second terminal DE may be the drain electrode. Each of the first, third to fifth, and seventh transistors T1, T3 to T5, and T7 included in the pixel circuit PXC of one sub-pixel may also include the semiconductor layer SCL, the gate electrode GE, the first terminal SE, and the second terminal DE.

The semiconductor layer SCL of each of the second and sixth transistors T2 and T6 may be provided and/or formed on the buffer film BFL. The semiconductor layer SCL may include a first contact area in contact with the first terminal SE and a second contact area in contact with the second terminal DE. An area between the first contact area and the second contact area may be a channel area.

The semiconductor layer SCL may be a semiconductor pattern made of polysilicon, amorphous silicon, an oxide semiconductor, or the like. The channel area, which is a semiconductor pattern that is not doped with impurities, may be an intrinsic semiconductor. The first contact area and the second contact area may be semiconductor patterns doped with impurities. Here, impurities such as n-type impurities, p-type impurities, and other metals may be used.

The gate electrode GE of each of the second and sixth transistors T2 and T6 may be provided and/or formed on a corresponding semiconductor layer SCL with the gate insulating film GI disposed therebetween. The gate electrode GE may be made of one or more of molybdenum (Mo), aluminum (Al), platinum (Pt), palladium (Pd), silver (Ag), mag-nesium (Mg), gold (Au), nickel (Ni), neodium (Nd), iridium (Ir), chromium (Cr), calcium (Ca), titanium (Ti), tantalum (Ta), tungsten (W), copper (Cu), but the present inventive concept is not limited thereto. The gate electrode GE may be formed of a single film or multi-film.

The gate insulating film GI may be an inorganic insulating film including an inorganic material. For example, the gate insulating film GI may include at least one of metal oxides such as a silicon nitride (SiNx), a silicon oxide (SiOx), a silicon oxynitride (SiON), and AlOx. However, the material of the gate insulating film GI is not limited to the above-described embodiments. In some embodiments, the gate insulating film GI may be formed as an organic insulating film including an organic material. The gate insulating film GI may be provided as a single film, but may be provided as a multi-film of at least two or more layers.

Each of the first terminal SE and the second terminal DE of each of the second and sixth transistors T2 and T6 may contact the first contact area and the second contact area of a corresponding semiconductor layer SCL through a contact hole passing through the first interlayer insulating film ILD1 and the gate insulating film GI. Each of the first and second terminals SE and DE may be made of one or more of molybdenum (Mo), aluminum (Al), platinum (Pt), palladium (Pd), silver (Ag), magnesium (Mg), gold (Au), nickel (Ni), neodium (Nd), iridium (Ir), chromium (Cr), calcium (Ca), titanium (T1), tantalum (Ta), tungsten (W), copper (Cu). In addition, the first and second terminals SE and DE may be formed as a single film or multi-film. For example, the first and second terminals SE and DE may have a stacked structure such as Ti/Al/Ti, Mo/Al/Mo, Mo/AlGe/Mo, Ti/Cu, or the like.

The first interlayer insulating film ILD1 may be an inorganic insulating film including an inorganic material. For example, the first interlayer insulating film ILD1 may include at least one of a silicon nitride (SiNx), a silicon oxide (SiOx), a silicon oxynitride (SiON), and AlOx. The first interlayer insulating film ILD1 may be provided as a single film, or may be provided as a multi-film of at least two or more layers.

In the above-described embodiment, the first and second terminals SE and DE of each of the second and sixth transistors T2 and T6 are described as separate electrodes electrically connected to the corresponding semiconductor layer SCL, but the present inventive concept is not limited thereto. In some embodiments, the first terminal SE of each of the second and sixth transistors T2 and T6 may be a contact area of one of the first and second contact areas adjacent to the channel area of the corresponding semiconductor layer SCL, and the second terminal DE of each of the second and sixth transistors T2 and T6 may be the other of the first and second contact areas adjacent to the channel area of the corresponding semiconductor layer SCL. In this case, the second terminal DE of each of the second and sixth transistors T2 and T6 may be electrically connected to the light emitting element OLED of the corresponding sub-pixel through a bridge electrode or a connection electrode.

Each of the second and sixth transistors T2 and T6 may be a low temperature poly silicon (LTPS) thin film transistor, but the present inventive concept is not limited thereto, and in some embodiments, it may be an oxide semiconductor thin film transistor. In addition, the case in which each of the second and sixth transistors T2 and T6 is a thin film transistor having a top gate structure is described as an example, but the present inventive concept is not limited thereto. In some embodiments, each of the second and sixth transistors T2 and T6 may be a thin film transistor having a bottom gate structure.

The second interlayer insulating film ILD2 may be provided on the second and sixth transistors T2 and T6 described above. The second interlayer insulating film ILD2 may be an inorganic insulating film including an inorganic material or an organic insulating film including an organic material. In some embodiments, the second interlayer insulating film ILD2 may include the same material as the first interlayer insulating film ILD1, but the present inventive concept is not limited thereto. The second interlayer insulating film ILD2 may be provided as a single film, or may be provided as a multi-film of at least two or more layers.

The passivation film PSV may be provided on the second interlayer insulating film ILD2. The passivation film PSV may include an organic insulating film, an inorganic insulating film, or the organic insulating film disposed on the inorganic insulating film. The inorganic insulating film may include at least one of a silicon oxide (SiOx), a silicon nitride (SiNx), a silicon oxynitride (SiON), and AlOx. The organic insulating film may include an organic insulating material capable of transmitting light. The organic insulating film may be, for example, at least one of a polyacrylates resin, an epoxy resin, a phenolic resin, a polyamides resin, a polyimides resin, an unsaturated polyesters resin, a poly-phenylen ethers resin, a poly-phenylene sulfides resin, and benzocyclobutene resin.

The display element portion DPL may include the light emitting element OLED provided on the passivation film PSV and emitting light.

The light emitting element OLED may include first and second electrodes AE and CE and a light emitting layer EML provided between the two electrodes AE and CE. Here, one of the first and second electrodes AE and CE may be an anode, and the other thereof may be a cathode. When the light emitting element OLED is a top light emitting type of organic light emitting element, the first electrode AE may be a reflective electrode, and the second electrode CE may be a transmissive electrode. In an embodiment of the present inventive concept, a case in which the light emitting element OLED is the top light emitting type of organic light emitting element and the first electrode AE is the anode will be described as an example.

The first electrode AE may be electrically connected to the second terminal DE of the sixth transistor T6 through a contact hole penetrating through the passivation layer PSV and the second interlayer insulating film ILD2. The first electrode AE may include a reflective film (not shown) capable of reflecting light and a transparent conductive film (not shown) disposed above or below the reflective film. For example, the first electrode AE may be formed as a multi-film including a lower transparent conductive film made of an indium tin oxide (ITO), a reflective film provided on the lower transparent conductive film and made of Ag, and an upper transparent conductive film provided on the reflective film and made of an indium tin oxide (ITO). At least one of the transparent conductive film and the reflective film may be electrically connected to the second terminal DE of the sixth transistor T6.

The display element portion DPL may further include a pixel defining film PDL provided with an opening exposing a portion of the first electrode AE, for example, an upper surface of the first electrode AE. The pixel defining film PDL may be an organic insulating film including an organic material. For example, the pixel defining film PDL may be formed as an organic insulating film of an acrylic resin, an epoxy resin, a phenolic resin, a polyamide resin, a polyimide resin, or the like.

Each of the first and second sub-pixels SP1 and SP2 included in each first pixel area PXA1 in the first display area A1 includes a light emitting area EMA and a non-light emitting area NEMA disposed adjacent to the light emitting area EMA. The non-light emitting area NEMA may surround the light emitting area EMA. In the present embodiment, the light emitting area EMA may be defined to correspond to a portion of the first electrode AE exposed by an opening of the pixel defining film PDL or corresponding to the light emitting layer EML.

The light emitting layer EML may be disposed in an area corresponding to the opening of the pixel defining film PDL. That is, the light emitting layer EML in each of the first and second sub-pixels SP1 and SP2 may be disposed to be separated from each other. The light emitting layer EML may include an organic material and/or an inorganic material. In the embodiment of the present inventive concept, the patterned light emitting layer EML is illustrated as an example, but in some embodiments, the light emitting layer EML may be commonly provided to the first pixels PXL1. A color of light generated in the light emitting layer EML may be one of red, green, blue, and white, but the color of light generated in the light emitting layer EML is not limited thereto. For example, the color of light generated in the light emitting layer EML may be one of magenta, cyan, and yellow.

The second electrode CE may be provided on the light emitting layer EML. The second electrode CE may be commonly provided to respective first and second sub-pixels SP1 and SP2. The second electrode CE may be provided in a plate shape so as to entirely correspond to the first display area A1, but the present inventive concept is not limited thereto. The second electrode CE may be made of one transparent conductive oxide of an indium tin oxide (ITO), an indium zinc oxide (IZO), an aluminum zinc oxide (AZO), a gallium doped zinc oxide (GZO), a zinc tin oxide (ZTO), a gallium tin oxide (GTO), and a fluorine doped tin oxide (FTO), or may be made of a semi-transmissive metal such as magnesium (Mg), silver (Ag), or an alloy of magnesium (Mg) and silver (Ag).

A hole injection layer (not shown) may be disposed between the first electrode AE and the light emitting layer EML, and an electron injection layer (not shown) may be disposed between the light emitting layer EML and the second electrode CE. The hole injection layer and the electron injection layer may be commonly provided to respective first and second sub-pixels SP1 and SP2.

A thin film encapsulation film TFE may be provided on the second electrode CE. The thin film encapsulation film TFE may be formed as a single film, and it may be formed as a multi-film. The thin film encapsulation film TFE may include a plurality of insulating films covering the light emitting element OLED. Specifically, the thin film encapsulation film TFE may include at least one inorganic film and at least one organic film. For example, the thin film encapsulation film TFE may have a structure in which an inorganic film and an organic film are alternately stacked.

Figure 12:
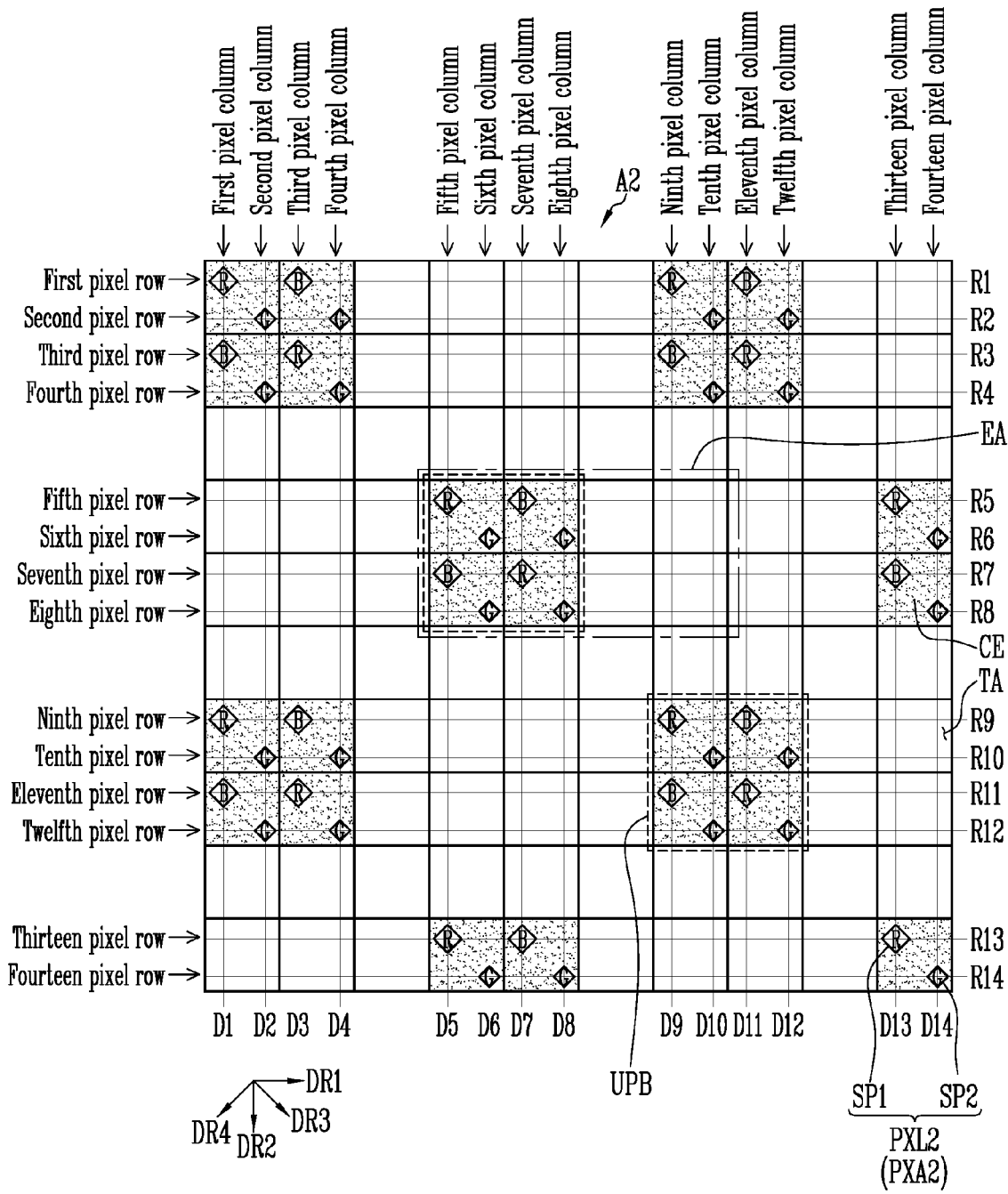
FIG. 12 illustrates a schematic top plan view of a second display area according to an embodiment of the present inventive concept.
Figure 13:
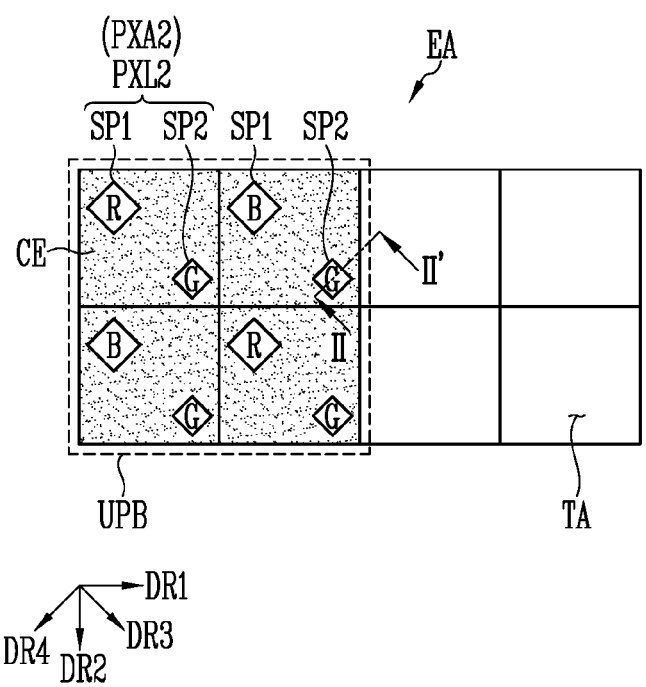
FIG. 13 illustrates a schematic enlarged top plan view of a portion EA of FIG. 12.
Figure 14:
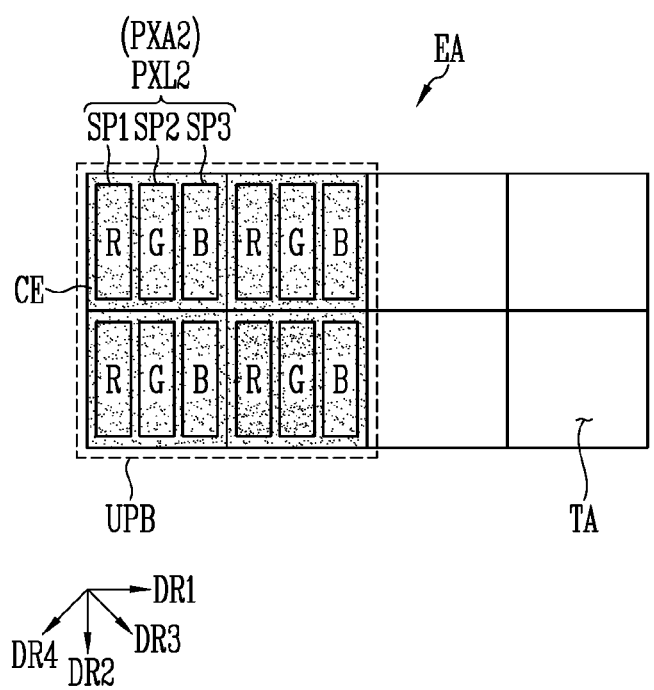
FIG. 14 and FIG. 15 illustrate modifications of FIG. 13.
Figure 15:
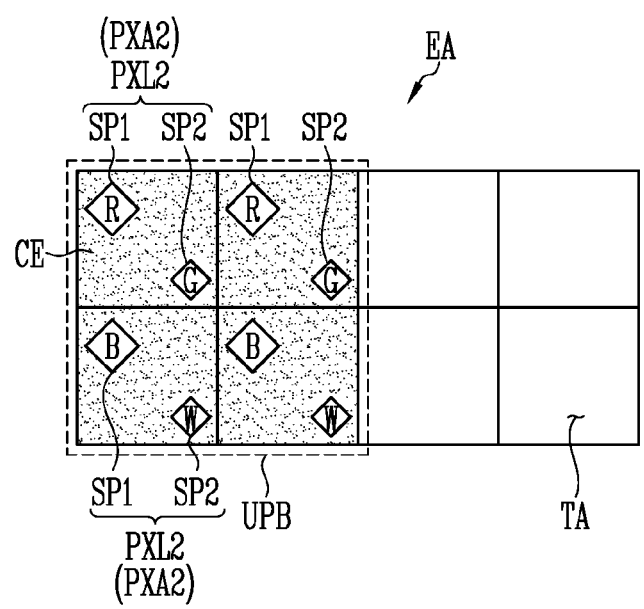
Figure 16:
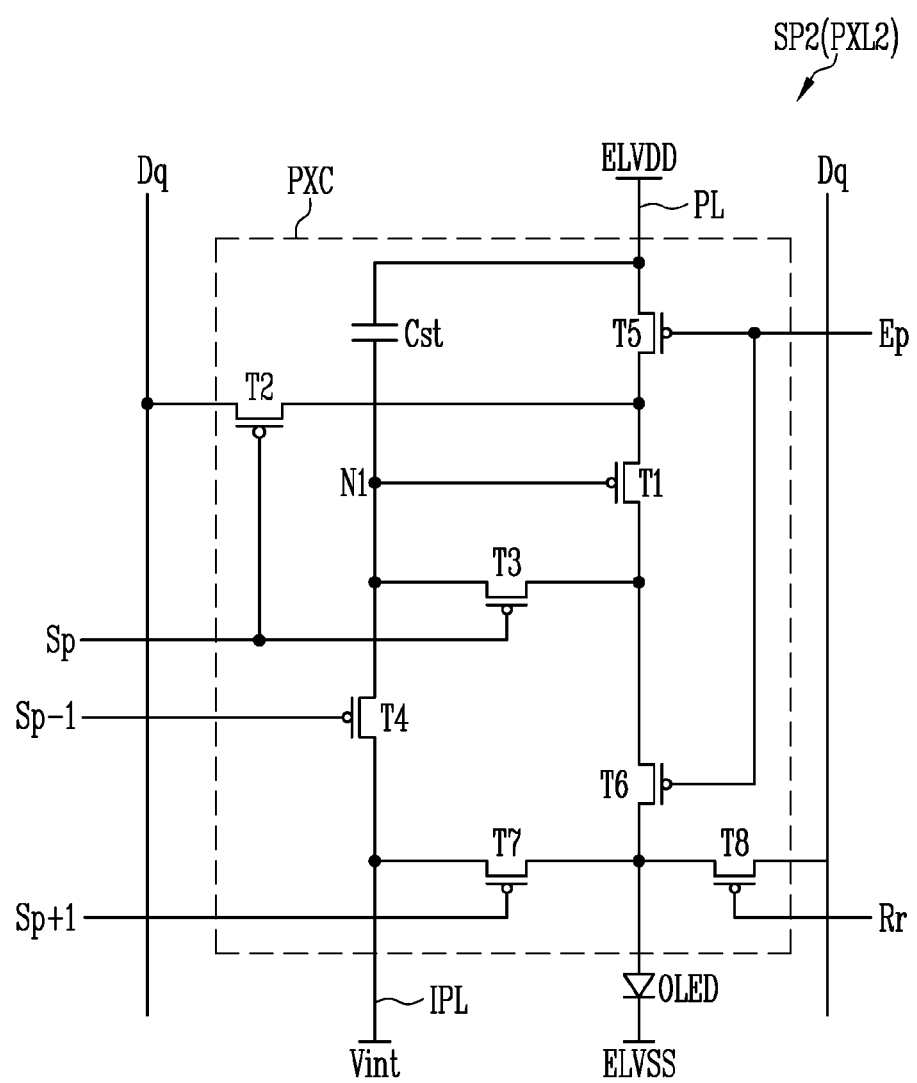
FIG. 16 illustrates a circuit diagram of an electrical connection relationship between constituent elements included in a second sub-pixel of FIG. 12.
Figure 17:
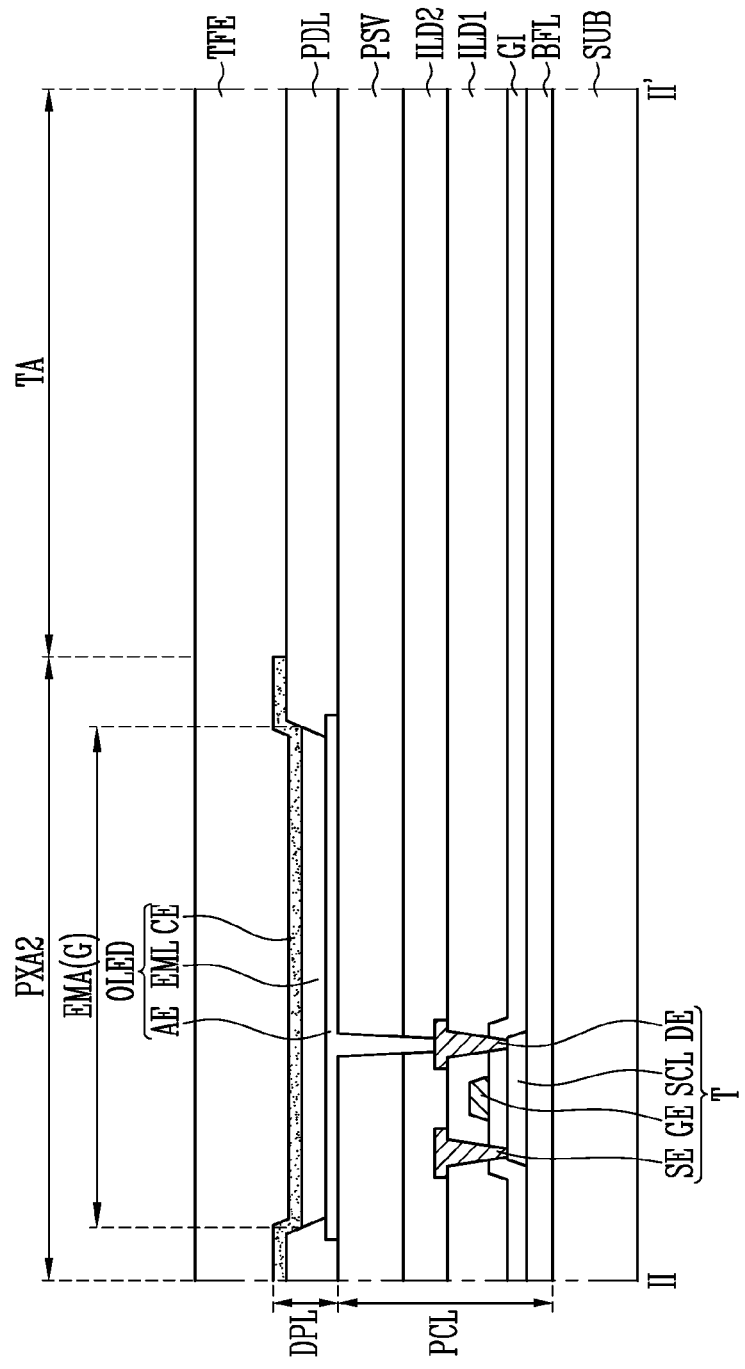
FIG. 17 illustrates a cross-sectional view taken along line II-II' of FIG. 13.
Figure 18:
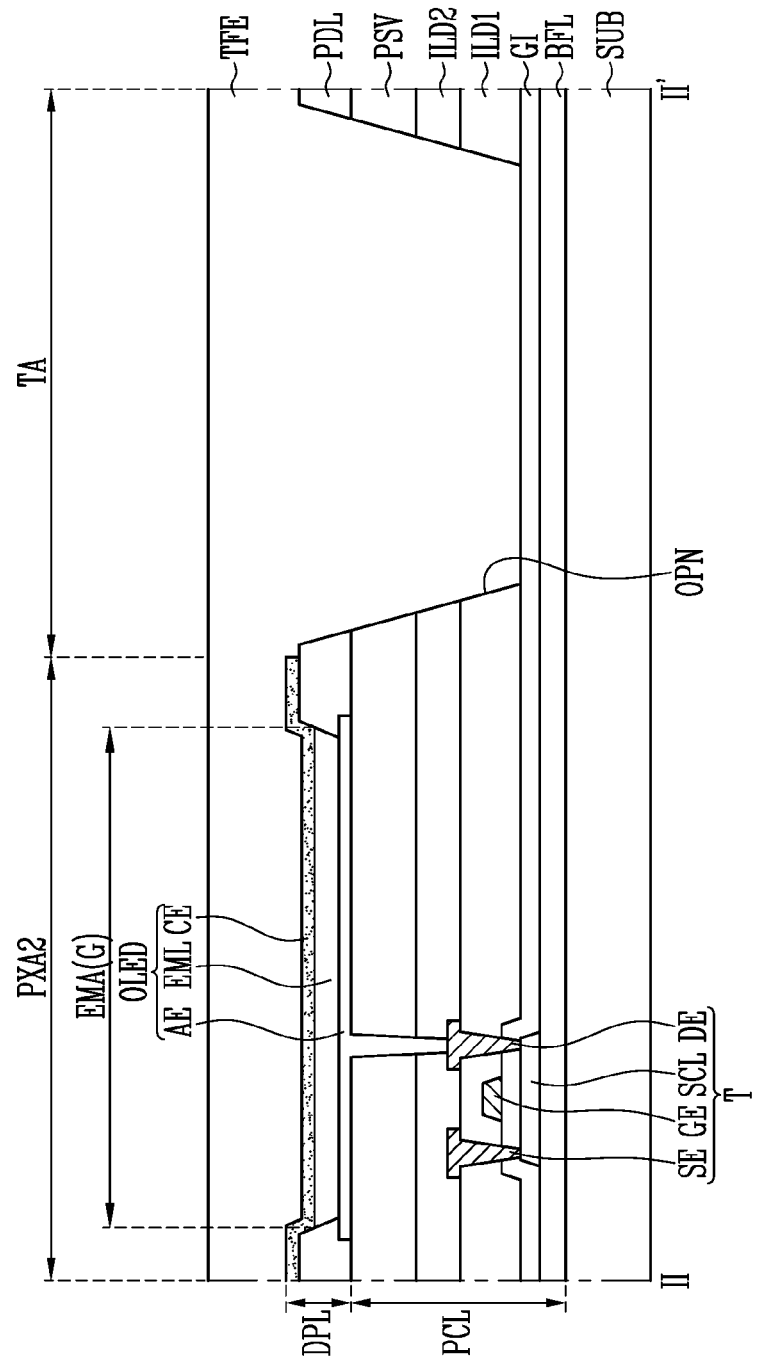
FIG. 18 and FIG. 19 illustrate modifications of FIG. 17.
Figure 19:
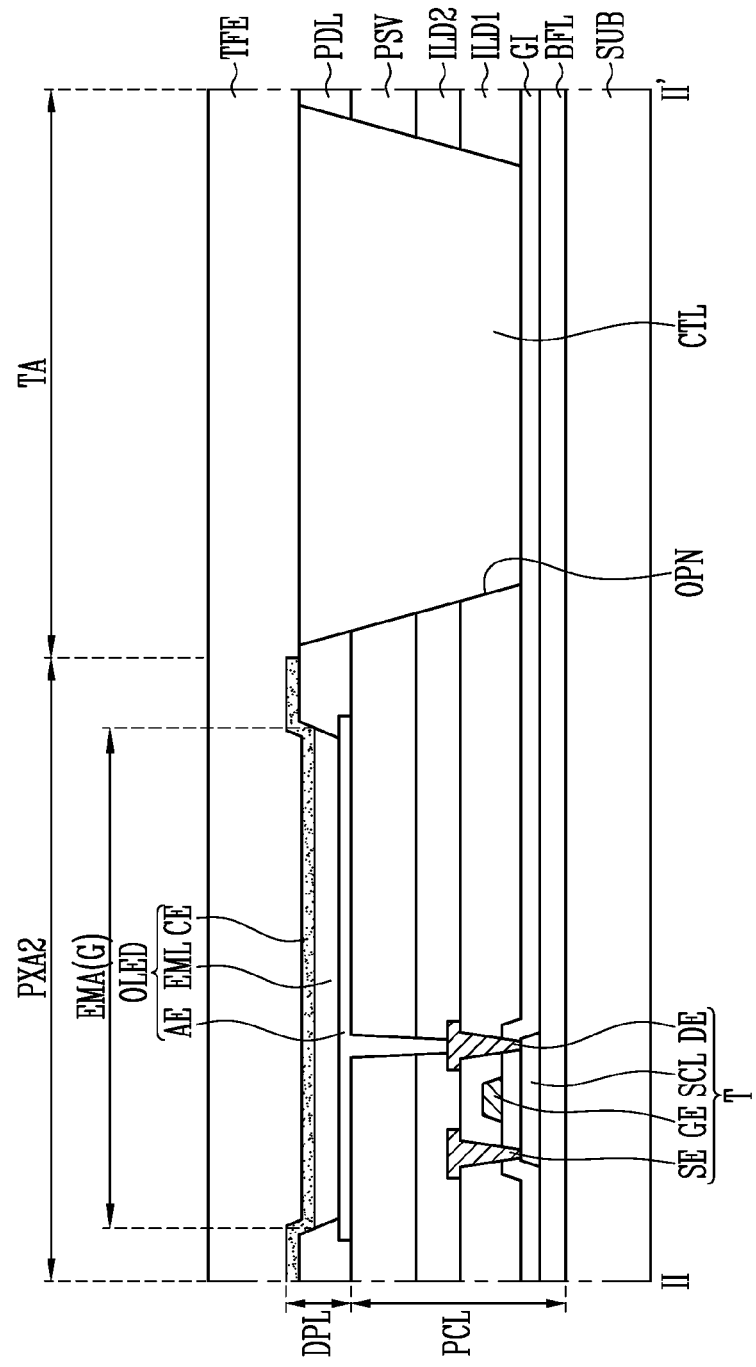

FIG. 12 illustrates a schematic top plan view of a second display area according to an embodiment of the present inventive concept. FIG. 13 illustrates a schematic enlarged top plan view of a portion EA of FIG. 12. FIG. 14 and FIG. 15 illustrate modifications of FIG. 13. FIG. 16 illustrates a circuit diagram of an electrical connection relationship between constituent elements included in a second sub-pixel of FIG. 12. FIG. 17 illustrates a cross-sectional view taken along line II-II' of FIG. 13. FIG. 18 and FIG. 19 illustrate modifications of FIG. 17.

FIG. 12 schematically illustrates sensing control lines R1 to R14 and data lines D1 to D14 disposed in the second display area A2, and reference numerals therein merely distinguish different lines.

Referring to FIG. 1 to FIG. 19, the display panel DP may include the display area DA in which the pixels PXL1 and PXL2 are disposed.

The display area DA may include the first display area A1 and the second display area A2 in which the pixels PXL1 and PXL2 are disposed at different densities. The pixels PXL1 and PXL2 may be disposed at different densities in the first display area A1 and the second display area A2. For example, the first pixels PXL1 may be disposed in the first display area A1 at a first density, and the second pixels PXL2 may be disposed in the second display area A2 at a second density. The second density may be set smaller than the first density. In the following embodiments, when the first pixels PXL1 and the second pixels PXL2 are collectively named, they are named as the pixels PXL1 and PXL2.

In one embodiment of the present inventive concept, a density (or pixel density) may be defined as a ratio (%) of an area in which the pixels PXL1 and PXL2 are disposed with respect to an entire area of a corresponding display area. The area in which the pixels PXL1 and PXL2 are disposed may be a total sum of respective areas of the pixels PXL1 and PXL2. An area of each of the pixels PXL1 and PXL2 may mean an area of a region including the pixel circuit PXC, a plurality of signal lines (not shown) connected to the pixel circuit PXC, and the light emitting element OLED. In some embodiments, the area of each of the pixels PXL1 and PXL2 may mean an area of a light emitting surface of the light emitting element OLED, for example, a size of a light emitting region in which light is emitted. For example, the area of each of the pixels PXL1 and PXL2 may be an area of the first electrode AE included in the light emitting element OLED, or an area of the light emitting layer EML.

In the following embodiments, the first density is defined as a ratio of an area in which the first pixels PXL1 are disposed with respect to an entire area of the first display area A1, and the second density is defined as a ratio of an area in which the second pixels PXL2 are disposed with respect to an entire area of the second display area A2.

The area in which the second pixels PXL2 are disposed with respect to the entire area in the second display area A2 may be smaller than that in the first display area A1. As the second pixels PXL2 are disposed at a relatively low density in the second display area A2, a transmittance of the second display area A2, for example, a light transmittance, may be higher than that of the first display area A1.

In an embodiment, the first density of the first pixels PXL1 may be about 3 to 5 times higher than the second density of the second pixels PXL2.

Meanwhile, the pixels PXL1 and PXL2 may emit light at different luminance in the first display area A1 and the second display area A2. For example, the first pixels PXL1 may emit light at the first luminance in the first display area A1, and the second pixels PXL2 may emit light at the second luminance in the second display area A2.

Since the second pixels PXL2 are disposed at a low density compared to the first pixels PXL1, the second pixels PXL2 may emit light with a high luminance compared to the first pixels PXL1 in response to the same gray level so that a boundary between the first display area A1 and the second display area A2 is not easily viewed by a user.

In the embodiment, a relationship between the first luminance of the first pixels PXL1 and the second luminance of the second pixels PXL2 in response to the same gray level may be inversely proportional to a density of the pixels PXL1 and PXL2. For example, the second luminance of the second pixels PXL2 may be about 3 to 5 times higher than the first luminance of the first pixels PXL1.

The second display area A2 may include a plurality of pixel rows and a plurality of pixel columns. In the embodiment, each pixel row includes pixels (or sub-pixels) arranged in the first direction DR1. Each pixel column includes pixels (or sub-pixels) arranged in the second direction DR2. The pixels (or sub-pixels) included in each pixel row may be connected to the same sensing control line R1 to R14. The pixels (or sub-pixels) in one pixel row may be connected to different data lines D1 to D14. The pixels (or sub-pixels) included in each pixel column may be connected to the same data line D1 to D14. The pixels (or sub-pixels) in one pixel column may be connected to different sensing control lines R1 to R14.

A configuration of the first pixels PXL1 of the first display area A1 and a configuration of the second pixels PXL2 of the second display area A2 may be different.

For example, a material of the signal lines connected to the first pixels PXL1 of the first display area A1 may be different from a material of the signal lines connected to the second pixels PXL2 of the second display area A2. For example, the material of the signal lines connected to the first pixels PXL1 of the first display area A1 may include an opaque metal, and the material of the signal lines connected to the second pixels PXL2 of the second display area A2 may include a transparent metal. In some embodiments, the signal lines connected to the pixels PXL1 and PXL2 in the first display area A1 and the second display area A2 are made of one of the opaque metal and the transparent metal, and a ratio of the signal lines made of the transparent metal in the second display area A2 may be higher than that of the signal lines made of the transparent metal in the first display area A1. In the embodiment of the present inventive concept, a light transmittance of the transparent metal may be higher than that of the opaque metal, for example, a reflective metal.

In another embodiment, a material of the first electrode AE of the light emitting element OLED included in the first pixels PXL1 of the first display area A1 and a material of the first electrode AE of the light emitting element OLED included in the second pixels PXL2 of the second display area A2 may be different. For example, the material of the first electrode AE of the light emitting element OLED included in the first pixels PXL1 of the first display area A1 may include an opaque metal, and the material of the first electrode AE of the light emitting element OLED included in the second pixels PXL2 of the second display area A2 may include a transparent metal. In some embodiments, the first electrodes AE of the pixels PXL1 and PXL2 in the first display area A1 and the second display area A2 are made of one of the opaque metal and the transparent metal, and a ratio of the first electrodes AE made of the transparent metal in the second display area A2 may be higher than that of the first electrodes AE made of the transparent metal in the first display area A1.

In another embodiment, a ratio of the second electrode CE of the light emitting element OLED included in the first pixels PXL1 of the first display area A1 and a ratio of the second electrode CE of the light emitting element OLED included in the second pixels PXL2 of the second display area A2 may be different. For example, a ratio of the second electrode CE of the light emitting element OLED included in the second pixels PXL2 of the second display area A2 may be lower than that of the second electrode CE of the light emitting element OLED included in the first pixels PXL2 of the first display area A1.

In another example, a layout of the first pixels PXL1 (for example, an arrangement relationship of elements included in the pixel circuit PXC) may be different from that of the second pixels PXL2. For example, the signal lines connected to the second pixels PXL2 may be designed to be narrower than the signal lines connected to the first pixels PXL1, or the signal lines connected to the second pixels PXL2 may be disposed to overlap each other with an insulating layer disposed therebetween. Accordingly, since an area occupied by the signal lines is reduced while an interval between the signal lines in the second display area A2 is secured, the light transmittance of the second display area A2 may be improved.

Each of the second pixels PXL2 may include the first sub-pixel SP1 and the second sub-pixel SP2. The first sub-pixel SP1 may be a red pixel R emitting red light or a blue pixel B emitting blue light, and the second sub-pixel SP2 may be a green pixel G emitting green light. Each second pixel PXL2 may be disposed in the second pixel area PXA2, and may realize color light or white light by combining light emitted from each of the first and second sub-pixels SP1 and SP2. In the above-described embodiment, the first and second sub-pixels SP1 and SP2 are described as forming one second pixel PXL2, but the present inventive concept is not limited thereto. In some embodiments, one second pixel PXL2 may include three sub-pixels or four sub-pixels.

In some embodiments, each second pixel PXL2 may include first to third sub-pixels SP1 to SP3 arranged in the same pixel row along the first direction DR1 as shown in FIG. 14. Each of the first to third sub-pixels SP1 to SP3 may have a stripe shape. The first sub-pixel SP1 is a red pixel R emitting red light, the second sub-pixel SP2 is a green pixel G emitting green light, and the third sub-pixel SP3 is a blue pixel emitting blue light B. In this case, the first to third sub-pixels SP1 to SP3 may have a rectangular structure and may be formed to have the same or similar area (or size).

In another embodiment, one second pixel PXL2 may include the first and second sub-pixels SP1 and SP2 as shown in FIG. 15. The first sub-pixel SP1 may be a red pixel R emitting red light or a blue pixel B emitting blue light, and the second sub-pixel SP2 may be a green pixel G emitting green light or a white pixel W emitting white light. The first sub-pixel SP1 may be repeatedly disposed along the second direction DR2 to form the first pixel column. For example, the first sub-pixel SP1 including the red pixel R and the first sub-pixel SP1 including the blue pixel B may be alternatingly disposed in the first pixel column. The second sub-pixel SP2 may be repeatedly disposed along the second direction DR2 to form the second pixel column. For example, the second sub-pixel SP2 including the green pixel G and the second sub-pixel SP2 including the white pixel W may be alternatingly disposed in the second pixel column.

In the embodiment, the first sub-pixel SP1 of the second pixel PXL2 may further include an eighth transistor T8 as shown in FIG. 16. The eighth transistor T8 may be connected between a data line Dq and the first electrode of the light emitting element OLED, for example, the anode thereof. q may be a natural number between 1 and m. A gate electrode of the eighth transistor T8 may be connected to a sensing control line Rr. r may be a natural number between 1 and k. When a sensing control signal having a gate-on voltage (for example, a low level voltage) is supplied to the sensing control line Rr, the eighth transistor T8 may be turned on, and then a voltage (hereinafter referred to as an anode voltage) of the anode of the light emitting element OLED may be sensed through the data line Dq.

Two data lines Dq shown in FIG. 16 are one data line electrically connected to each other, but are separately shown in the circuit diagram for convenience of description. However, the present inventive concept is not limited thereto, and in another embodiment, the two data lines Dq may be different data lines that are separated from each other, and in this case, respective sub-pixels SP1 and SP2 of the second pixel PXL2 may be connected to the two data lines.

Each of the first and second sub-pixels SP1 and SP2 in the second pixel PXL2 may include the pixel circuit portion PCL including at least one transistor and the display element portion DPL including the light emitting element OLED. The first and second sub-pixels SP1 and SP2 in the second pixel PXL2 may have a substantially similar or identical structure. Therefore, a description of a configuration included in the first sub-pixel SP1 in the second pixel PXL2 will be replaced with the description of the configuration of the second sub-pixel SP2 described with reference to FIG. 16 to FIG. 19.

The second sub-pixel SP2 may include the substrate SUB, the pixel circuit portion PCL including a pixel circuit (see the PXC in FIG. 16) provided with at least one transistor, the display element portion DPL provided on the pixel circuit portion PCL, and the thin film encapsulation film TFE covering the display element portion DPL. Here, the thin film encapsulation film TFE may have the same configuration as the thin film encapsulation film TFE of the first display area A1 shown in FIG. 11. In FIG. 17, only a driving transistor T which is directly connected to and drives the light emitting element OLED is shown for convenience. The driving transistor T may be connected to the light emitting element OLED via a sixth transistor. The driving transistor T of FIG. 17 may have the same configuration as the first transistor T1 of FIG. 16.

The pixel circuit portion PCL may include the driving transistor T and at least one insulating film. Here, the insulating film may include the buffer film BFL, the gate insulating film GI, the first and second interlayer insulating films ILD1 and ILD2, and the passivation film PSV sequentially stacked on the substrate SUB. The buffer film BFL, the gate insulating film GI, the first and second interlayer insulating films ILD1 and ILD2, and the passivation film PSV may have the same configurations as the buffer film BFL, the gate insulating film GI, the first and second interlayer insulating films ILD1 and ILD2, and the passivation film PSV of the first display area A1 shown in FIG. 6. The driving transistor T includes the semiconductor layer SCL, the gate electrode GE, and the first and second terminals SE and DE, and it may be formed as a thin film transistor having the same structure as the second and sixth transistors T2 and T6 of the first display area A1 shown in FIG. 11.

The display element portion DPL may include the light emitting element OLED including the first electrode AE, the light emitting layer EML, and the second electrode CE. Here, the light emitting layer EML may emit green light. The light emitting area EMA of the second sub-pixel SP2 is an area in which green light is emitted, and may be defined (or partitioned) to correspond to one area of the first electrode AE or the light emitting layer EML exposed by the opening of the pixel defining film PDL.

In the second display area A2, a plurality of unit pixel blocks UPB repeatedly arranged at a predetermined interval may be disposed. The unit pixel block UPB may be a virtual unit block having a predetermined area including two second pixels PXL2 adjacent to each other in the first direction DR1 and two second pixels PXL2 adjacent to the two second pixels PXL2 in a second direction DR2 crossing the first direction DR1. For example, in the second display area A2, four second pixels PXL2 disposed adjacent to each other along the first direction DR1 and the second direction DR2 may be grouped into one group to form each unit pixel block UPB.

Meanwhile, the second display area A2 may include a transmissive area TA through which light is transmitted. In the embodiment of the present inventive concept, the transmissive area TA may be one area except the unit pixel blocks UPB in the second display area A2, and may be a transmissive window (or transparent window) in which the second pixels PXL2 are not disposed. That is, the transmissive area TA may be an area in which some elements of the pixel circuit portion PCL included in each second pixel PXL2 (for example, the pixel circuit (see the PXC of FIG. 10)) and some elements of the display element portion DPL (for example, the light emitting element OLED) are not disposed. As some elements of each of the pixel circuit portion PCL and the display element portion DPL are not disposed in the transmissive area TA, only an insulating film provided between elements included in the pixel circuit portion PCL and between elements included in the display element portion DPL may be disposed in the transmissive area TA. In other words, the transmissive area TA may be an area in which elements included in the first and second sub-pixels SP1 and SP2, for example, the pixel circuit portion PCL and the display element portion DPL, are not disposed (or not provided).

As shown in FIG. 17, the transmissive area TA may serve as a transmissive window in which only the buffer film BFL, the gate insulating film GI, the first and second interlayer insulating films ILD1 and ILD2, the passivation film PSV, the pixel defining film PDL, and the thin film encapsulation film TFE, which are sequentially stacked on the substrate SUB, are disposed and through which incident light is transmitted.

The transmissive area TA may be an area in which the second electrode CE, which may have the greatest influence on light transmittance, is removed. In this case, the second electrode CE may be selectively disposed in the second display area A2. That is, the second electrode CE may be disposed only in the second pixel areas PXA2, and may not be disposed in the transmissive area TA.

In some embodiments, the transmissive area TA may include an opening OPN for minimizing loss of light traveling through the transmissive area TA as shown in FIG. 18. In the embodiment of the present inventive concept, the opening OPN may be formed by removing a portion of the insulating film corresponding to the transmissive area TA. For example, the opening OPN may be formed by removing the first and second interlayer insulating films ILD1 and ILD2, the passivation film PSV, and the pixel defining film PDL from the transmissive area TA. However, the insulating films removed to form the opening OPN are not limited to the above-described example. For example, the gate insulating film GI or the buffer film BFL may also be removed to form the opening OPN.

When the opening OPN is formed in the transmissive area TA, the thin film encapsulation film TFE may be provided to fill the inside of the opening OPN. In this case, the thin film encapsulation film TFE may be formed of a material (or substance) that transmits light in order to minimize loss of light passing through the opening OPN. In some embodiments, when the opening OPN is formed in the transmissive area TA, as shown in FIG. 19, an intermediate layer CTL may be provided to fill the opening OPN. For example, the intermediate layer CTL may be an air layer filling the opening OPN to minimize loss of light transmitting (or passing through) the opening OPN. In some embodiments, the intermediate layer CTL may be a transparent adhesive layer (or bonding layer) (for example, an optically clear adhesive) for increasing adhesive force between an insulating film exposed by the opening OPN (for example, the gate insulating film GI) and the thin film encapsulation film TFE, while minimizing the loss of light passing through (or penetrating through) the opening OPN. A material of the intermediate layer CTL is not limited to the above-described embodiment, and may be variously selected from materials that minimize the loss of light passing through (or penetrating through) the transmissive area TA.

As described above, since the second display area A2 includes the transmissive area TA in which the second pixels PXL2 are not disposed, it may have light transmittance per unit area that may be relatively higher than that of the first display area A1.

The second display area A2 may overlap the sensor SR that is disposed under the substrate SUB and receives or emits light. As the transmissive area TA through which light is transmitted is provided in the second display area A2, an amount (or intensity) of light incident to the sensor SR disposed to correspond to the second display area A2 increases to be able to improve sensing capability (or sensing accuracy, recognition rate) of the sensor SR.

Hereinafter, a method of compensating for the second pixels PXL2 will be described with reference to FIG. 20 and FIG. 21.

Figure 20:
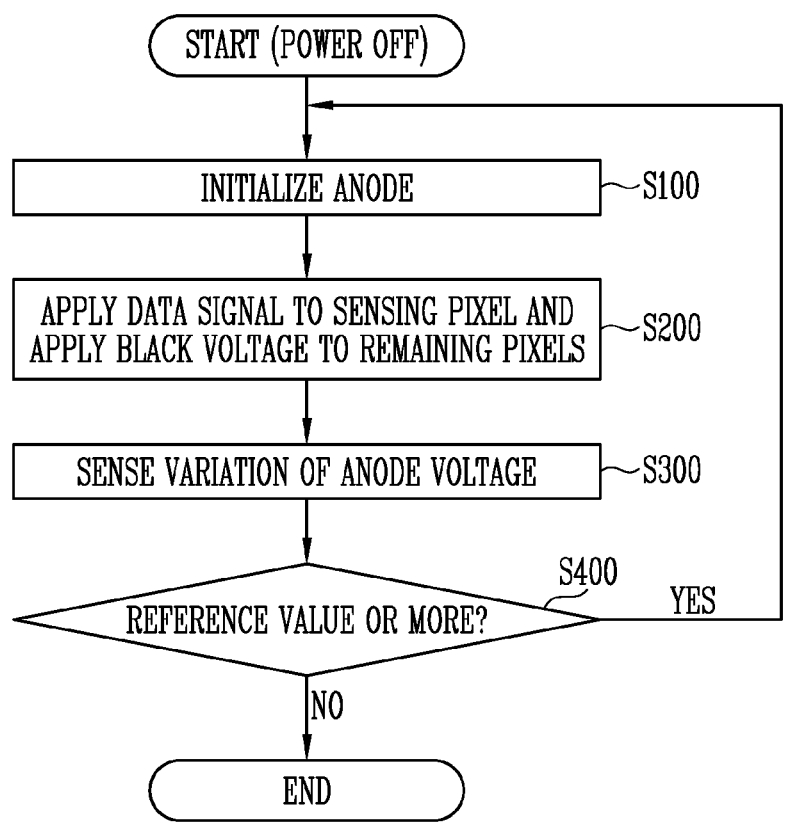
FIG. 20 illustrates an algorithm flowchart of a driving method of a display device according to an embodiment of the present inventive concept.

FIG. 20 illustrates an algorithm flowchart of a driving method of a display device according to an embodiment of the present inventive concept. FIG. 21 illustrates a graph with respect to luminance versus time of display devices according to an embodiment and a comparative example of the present inventive concept.

Figure 21:
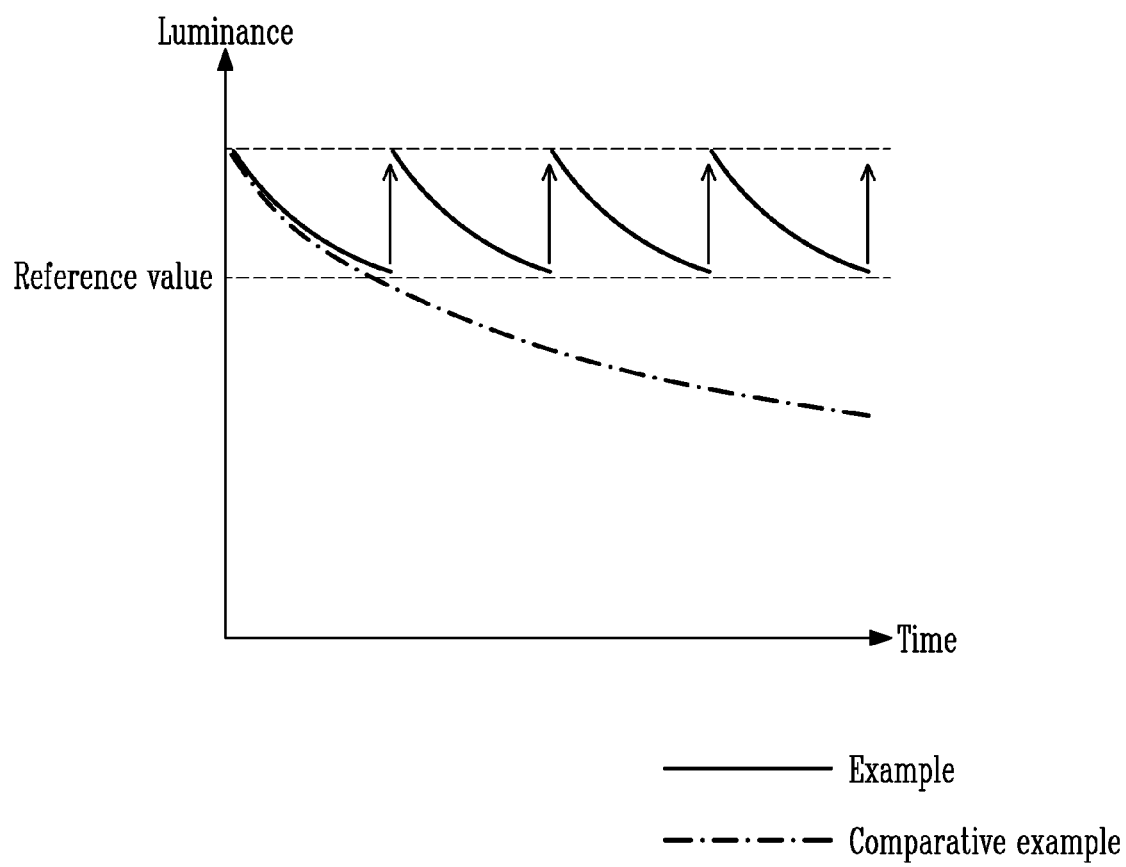
FIG. 21 illustrates a graph with respect to luminance versus time of display devices according to an embodiment and a comparative example of the present inventive concept.

In FIG. 21, a graph showing a comparative example corresponds to an example in which sensing and compensation of the second pixels PXL2 of FIG. 20 are not performed. Since the sensing and compensation of the second pixels PXL2 are applied to sensing and compensation of each of all the sub-pixels included in the second pixels PXL2, and the second pixels PXL2 and the sub-pixels will be together described below.

The display device 100 includes a display period that is a period for displaying an image and a non-display period that is a period during which no image is displayed. The non-display period may correspond to a period in which a user powers off the display device 100 or a period in which the display device 100 waits without displaying an image in a power-on state.

As described above, since the second pixels PXL2 emit light with higher luminance than that of the first pixels PXL1 in response to the same gray level, each of the light emitting elements OLED included in the second pixels PXL2 may have a relatively high amount of degradation. When degradation of the second pixels PXL2 continues, a boundary between the first display area A1 and the second display area A2 may be easily viewed by the user.

The driving method of the display device 100 may include a compensation period for compensating for the degradation of the second pixels PXL2. In the embodiment, the compensation period may be included in the non-display period described above.

In the compensation period, the second pixels PXL2 (the sub-pixels) of the second display area A2 may be compensated. In addition, in order to determine need for compensation of each of the second pixels PXL2 (the sub-pixels) of the second display area A2 in the compensation period, the anode voltage of the light emitting element OLED included in each of the second pixels PXL2 (the sub-pixels) may be sensed. The need for compensation of the pixel may be determined by providing a data signal corresponding to a specific gray to a pixel to be sensed and sensing the anode voltage of the light emitting element OLED.

That is, the anode voltage of the light emitting element OLED may be sensed in the compensation period, and a compensation voltage may be provided to the driving transistor and/or the anode of the light emitting element OLED.

In the embodiment, all of the second pixels PXL2 (the sub-pixels) disposed in the second display area A2 may be sequentially sensed and compensated for. For example, sensing control signals having pulses of a gate-on level may be sequentially provided for each pixel row of the pixel rows. While the sensing control signal having the pulse of the gate-on level is provided to one pixel row, the anode voltages of the light emitting elements OLED may be sequentially sensed through another data line Dq to which the pixels (the sub-pixels) included in the one pixel row are respectively connected, and then whether to compensate for the pixel may be determined. In the embodiment, the periods in which the anode voltages of the light emitting elements OLED of the second pixels PXL2 (the sub-pixels) are sensed may be non-overlapped.

Referring to FIG. 20 and FIG. 21, the driving method of the display device 100 in the compensation period may include initializing the anode of the light emitting element OLED (S100); applying the data signal to the sensing pixel and applying a black voltage to the remaining pixels (S200); sensing the voltage of the anode (S300); and checking whether a variation value of the anode voltage is equal to or less than a reference value (S400). Here, the sensing pixel means a specific target pixel (specific target sub-pixel) to be sensed among the second pixels PXL2 (sub-pixels).

The initializing (S100) of the anode of the light emitting element OLED corresponds to initializing the anode of the light emitting element OLED at a preset value by applying a specific voltage to the anode of the light emitting element OLED in the sensing pixel. For example, the power supply part 16 may provide the initializing voltage Vint to the sensing pixel. Accordingly, before the anode voltage of the light emitting element OLED of each of all the second pixels PXL2 (the sub-pixels) of the second display area A2 is sensed, the anode voltage of the light emitting element OLED may be initialized at the initializing voltage Vint. Therefore, in subsequent steps, luminance with respect to the anode voltage of the light emitting element OLED may be accurately measured.

Step S200 of applying the data signal to the sensing pixel and applying the black voltage to the remaining pixels corresponds to a step of applying a data signal corresponding to a specific gray to the sensing pixel and applying a black voltage to the remaining other pixels.

Step S300 of sensing the anode voltage corresponds to a step of sensing the anode voltage of the light emitting element OLED in the sensing pixel and checking a variation value. When a data signal corresponding to the specific gray is applied to the sensing pixel, the anode voltage is sensed through the data line Dj, and the variation value thereof may be checked.

Step S400 of checking whether the variation value of the anode voltage is equal to or less than the reference value corresponds to comparing the variation value of the anode voltage of the light emitting element OLED in the sensing pixel with a predetermined reference value. In the present step, the display device 100 may sense the anode voltage of the light emitting element OLED in the sensing pixel to check whether the variation value of the anode voltage exceeds the reference value.

When the variation value of the anode voltage exceeds the reference value, compensation for the sensing pixel may be performed, and step S100 of initializing the anode of the light emitting element OLED may be again performed. When the value of the sensed anode voltage exceeds the reference value, no additional compensation may be performed. In this manner, the degradation of each of the second pixels PXL2 (the sub-pixels) disposed in the second display area A2 may be compensated for, and it is possible to minimize that the boundary between the first display area A1 and the second display area A2 is viewed by the user.

Luminance of the second display area of the display device according to the comparative example in which the second pixels PXL2 (the sub-pixels) are not compensated may decrease with time due to the degradation. However, since the above-described compensation is performed for the second display area A2 of the display device 100 according to the present embodiment, luminance may not decrease with time because the degradation of each of the second pixels PXL2 is compensated. Therefore, the boundary between the first display area A1 and the second display area A2 may not be easily viewed by the user in the display device 100 according to the present embodiment.

Hereinafter, a display device according to another embodiment will be described. Hereinafter, a description for the same constituent elements as those of FIG. 1 to FIG. 21 is omitted, and the same or similar reference numerals are used for the same constituent elements as those of FIG. 1 to FIG. 21.

Figure 22:
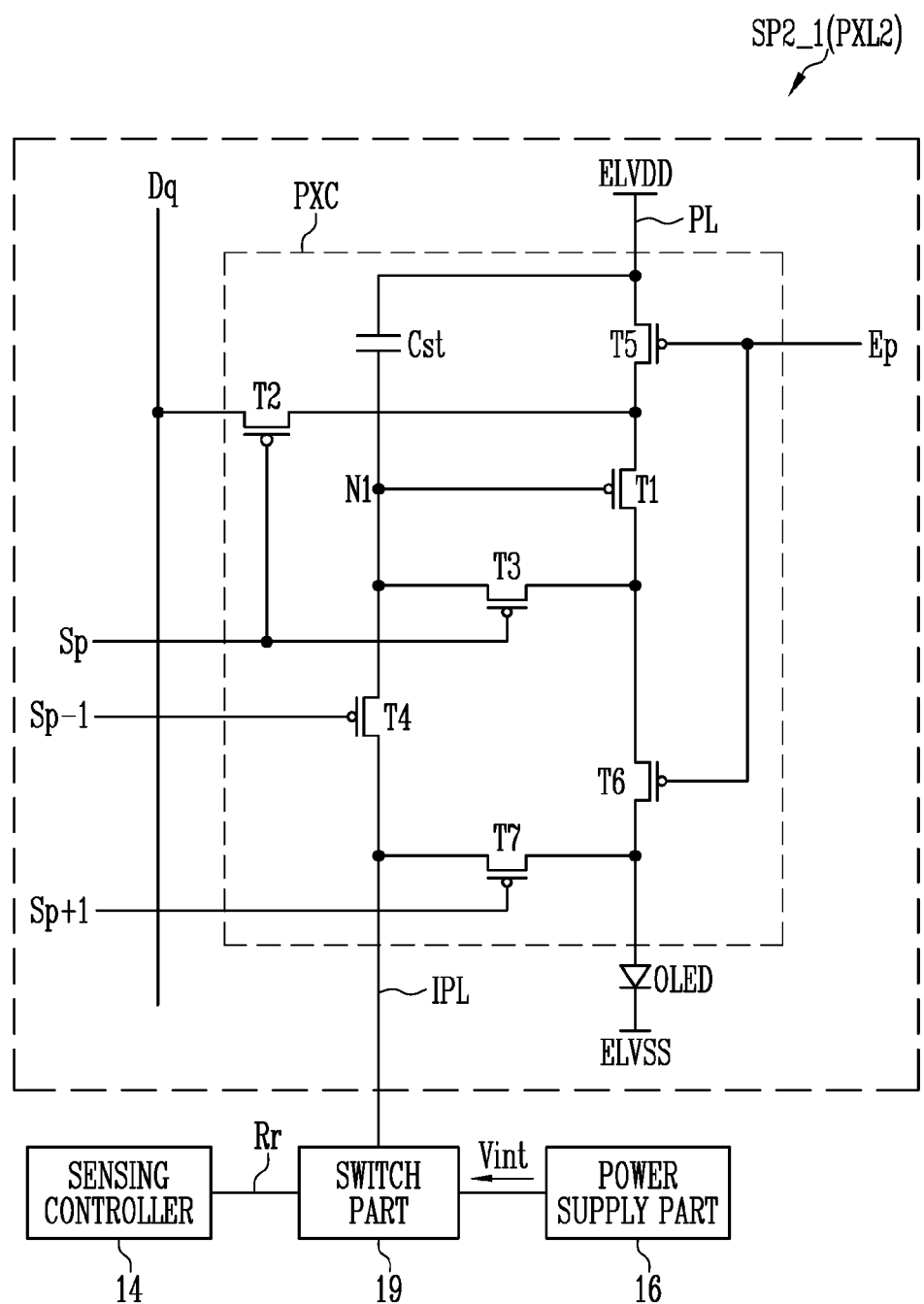
FIG. 22 illustrates a circuit diagram of an electrical connection relationship between constituent elements included in a second sub-pixel of a second pixel in a display device according to another embodiment of the present inventive concept.

FIG. 22 illustrates a circuit diagram of an electrical connection relationship between constituent elements included in a second sub-pixel of a second pixel in a display device according to another embodiment of the present inventive concept.

Referring to FIG. 22, a second sub-pixel SP2_1 of the second pixels PXL2 according to the present embodiment differs from the second sub-pixel SP2 in that the eighth transistor T8 is omitted and a switch portion 19 connected to the initializing power line IPL is further included.

The second sub-pixel SP2_1 of the second pixels PXL2 may be connected to the initializing power line IPL and the initializing power line IPL may be connected to the switch portion 19.

The sensing controller 14 may receive the sensing control signal from the timing controller 11 to determine whether to provide the initializing voltage Vint to the second sub-pixel SP2_1 or to sense the anode voltage of the light emitting element OLED. In response thereto, the switch part 19 may select whether to electrically connect the sensing controller 14 or the power supply part 16 to the initializing power line IPL.

In the embodiment, the switch part 19 may include at least one transistor. Here, the transistor may include various kinds such as a thin film transistor (TFT), a field effect transistor (FET), and a bipolar junction transistor (BJT).

In the present embodiment, the sensing controller 14 may sense the anode voltage of the light emitting element OLED. When a scan signal Sp+1 of a gate-on voltage is provided to the seventh transistor T7 and the sensing control signal of the gate-on voltage is provided to the switch part 19, the sensing controller 14 may sense the anode voltage of the light emitting element OLED through the seventh transistor T7 and the initializing power line IPL.

Figure 23:
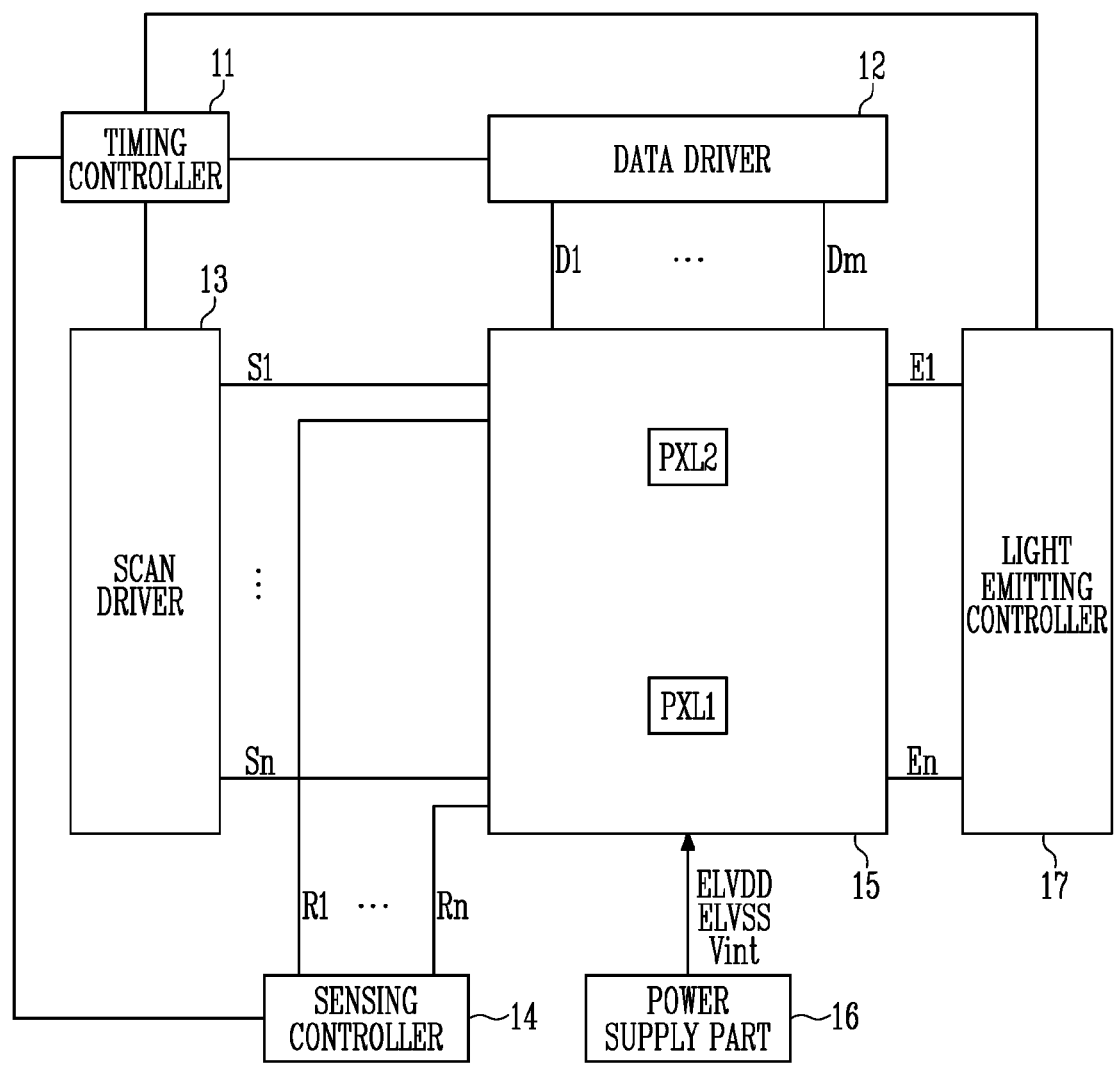
FIG. 23 illustrates a schematic block diagram of a display device according to another embodiment of the present inventive concept.
Figure 24:
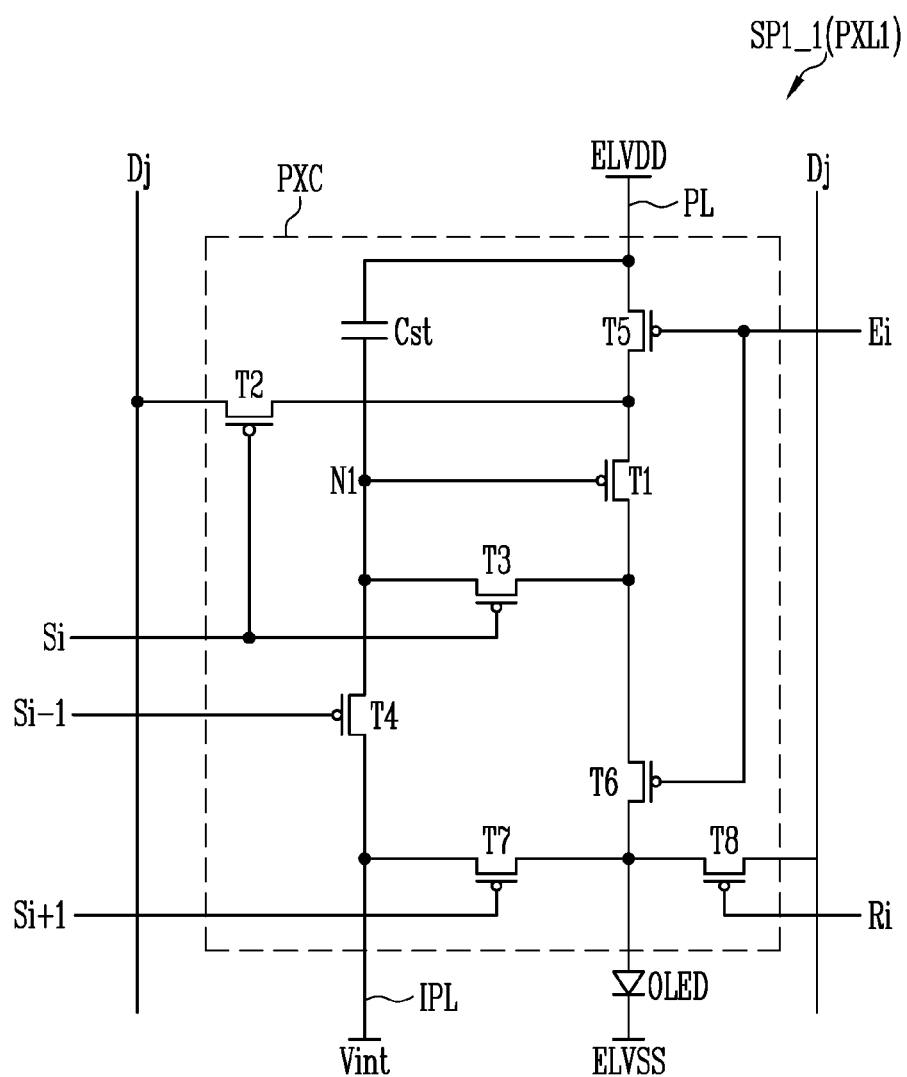
FIG. 24 is a circuit diagram of an electrical connection relationship between constituent elements included in a first sub-pixel of a first pixel in the display device of FIG. 23.

FIG. 23 illustrates a schematic block diagram of a display device according to another embodiment of the present inventive concept. FIG. 24 is a circuit diagram of an electrical connection relationship between constituent elements included in a first sub-pixel of a first pixel in the display device of FIG. 23.

Referring to FIG. 23 and FIG. 24, the sensing controller 14 may receive a clock signal, a control signal, and the like from the timing controller 11 to generate sensing control signals to be provided to sensing control lines R1 to Rn. The sensing control lines R1 to Rn may be connected to the first pixels PXL1 as well as the second pixels PXL2. A circuit diagram of the first pixels PXL1 may be configured to be equal to the circuit diagram of the second pixels PXL2.

In the compensation period, in both the first pixels PXL1 and the second pixels PXL2, the anode voltage of each of the light emitting elements OLED is sensed, and each of the pixels PXL1 and PXL2 may be compensated for.

While embodiments of the inventive concept are described with reference to the attached drawings, those with ordinary skill in the technical field of the present inventive concept pertains will be understood that the present inventive concept may be carried out in other specific forms without changing the technical idea or essential features. Therefore, it is to be understood that the above-described embodiments are for illustrative purposes only, and the scope of the present inventive concept is not limited thereto.

The invention claimed is:

1. A display device comprising:
a display panel including a first display area in which a plurality of first pixels are disposed at a first density and a second display area in which a plurality of second pixels are disposed at a second density lower than the first density; and
at least one sensor disposed in the second display area and not disposed in the first display area of the display panel,
wherein the plurality of first pixels and the plurality of second pixels are connected to scan lines providing scan signals and data lines providing data signals,
wherein the plurality of first pixels include a plurality of first pixel circuits and a plurality of first light emitting elements connected to the plurality of first pixel circuits, respectively, and the plurality of second pixels include a plurality of second pixel circuits and a plurality of second light emitting elements connected to the plurality of second pixel circuits, respectively, each of the plurality of first light emitting elements and the plurality of second light emitting elements emitting light, and
wherein each of the plurality of first pixel circuits does not include a transistor connected between an anode of a first light emitting element and a first data line connected to a first pixel circuit, and at least one of the plurality of second pixel circuits includes a transistor connected to a sensing control line and connected between an anode of a second light emitting element and a second data line connected to a second pixel circuit.

2. The display device of claim 1, wherein the plurality of second pixels disposed in one direction among the plurality of second pixels are connected to a same sensing control line.

3. The display device of claim 1, wherein a luminance of the plurality of second pixels is higher than that of the plurality of first pixels for the same gray level.

4. The display device of claim 1, wherein a density of the plurality of first pixels is three to five times higher than that of the plurality of second pixels.

5. The display device of claim 1, wherein a gate electrode of the transistor being connected to a sensing control line.

6. The display device of claim 5, wherein the number of transistors of each of the plurality of second pixels is different from that of each of the plurality of first pixels.

7. The display device of claim 1, wherein the sensor includes a camera.

8. The display device of claim 1, wherein the second display area is surrounded by the first display area.

9. The display device of claim 1, wherein the second display area includes a light emitting area and a transmissive area through which light is transmitted.

10. A display device comprising:
a scan driver providing a scan signal through scan lines;
a data driver providing a data signal through data lines;
a sensing controller providing a sensing control signal through sensing control lines; and
a display part including a first display area in which a plurality of first pixels are disposed at a first density and a second display area in which a plurality of second pixels are disposed at a second density lower than the first density and overlapping a sensor,
wherein the plurality of first pixels and the plurality of second pixels are connected to the scan lines and the data lines, respectively,
wherein the plurality of first pixels include a plurality of first pixel circuits and a plurality of first light emitting elements connected to the plurality of first pixel circuits, respectively, and the plurality of second pixels include a plurality of second pixel circuits and a plurality of second light emitting elements connected to the plurality of second pixel circuits, respectively, each of the plurality of first light emitting elements and the plurality of second light emitting elements emitting light, and
wherein each of the plurality of first pixel circuits does not include a transistor connected between an anode of a first light emitting element and a first data line connected to a first pixel circuit, and at least one of the plurality of second pixel circuits includes a transistor connected to a sensing control line and connected between an anode of a second light emitting element and a second data line connected to a second pixel circuit.

11. The display device of claim 10, wherein the plurality of second pixels includes a plurality of pixel rows formed of pixels disposed in one direction, and the plurality of pixel rows are respectively connected to one sensing control line.

12. The display device of claim 11, wherein the sensing control signal is sequentially provided to respective pixel rows.

13. The display device of claim 12, wherein the sensing controller is a shift register.

14. The display device of claim 11, wherein pixels included in one of the plurality of pixel rows are connected to different data lines.

15. The display device of claim 14, wherein anode voltages of light emitting elements connected to a same data line are sequentially sensed through a same data line.

16. The display device of claim 10, wherein an anode voltage of a light emitting element is sensed through a data line when a sensing control signal having a gate-on voltage is supplied to each of the plurality of second pixels.

17. The display device of claim 10, wherein the sensing controller is included in the scan driver.

* * * * *